(12) United States Patent
Takahashi et al.

(10) Patent No.: US 8,648,263 B2
(45) Date of Patent: *Feb. 11, 2014

(54) WIRING BOARD AND METHOD OF MANUFACTURING WIRING BOARD

(75) Inventors: Michimasa Takahashi, Gifu (JP); Masakazu Aoyama, Gifu (JP)

(73) Assignee: Ibiden Co., Ltd., Ogaki-shi (JP)

( * ) Notice: Subject to any disclaimer, the term of this patent is extended or adjusted under 35 U.S.C. 154(b) by 1124 days.

This patent is subject to a terminal disclaimer.

(21) Appl. No.: 12/050,771

(22) Filed: Mar. 18, 2008

(65) Prior Publication Data

US 2008/0283276 A1 Nov. 20, 2008

Related U.S. Application Data

(60) Provisional application No. 60/938,596, filed on May 17, 2007.

(51) Int. Cl.
*H01R 12/04* (2006.01)

(52) U.S. Cl.
USPC .......................................................... 174/264

(58) Field of Classification Search
USPC ................................................. 174/255, 264
See application file for complete search history.

(56) References Cited

U.S. PATENT DOCUMENTS

| 6,756,663 | B2 * | 6/2004 | Shiraishi et al. | 257/686 |
| 7,705,247 | B2 * | 4/2010 | Kim et al. | 174/264 |
| 2004/0089471 | A1 * | 5/2004 | Andoh et al. | 174/262 |
| 2009/0154132 | A1 * | 6/2009 | Okamoto et al. | 361/804 |

FOREIGN PATENT DOCUMENTS

| JP | 3-151656 | 6/1991 |
| JP | 5-152693 | 6/1993 |
| JP | 11-074651 | 3/1999 |
| JP | 2000-013019 | 1/2000 |
| JP | 2002-064271 | 2/2002 |
| JP | 2004-349277 | 12/2004 |
| JP | 2005-079402 | 3/2005 |
| JP | 2005-236205 | 9/2005 |
| JP | 2005-268505 | 9/2005 |
| JP | 2005-336287 | 12/2005 |
| JP | 2006-114741 | 4/2006 |
| JP | 2006-202891 | 8/2006 |
| WO | WO 2005/029934 | 3/2005 |

OTHER PUBLICATIONS

U.S. Appl. No. 12/050,646, filed Mar. 18, 2008, Takahashi, et al.

* cited by examiner

*Primary Examiner* — Chau Nguyen
(74) *Attorney, Agent, or Firm* — Oblon, Spivak, McClelland, Maier & Neustadt, L.L.P.

(57) ABSTRACT

A wiring board and a method of forming a wiring board including a first substrate, a second substrate having a smaller mounting area than a mounting area of the first substrate, and a base substrate laminated between the first substrate and the second substrate such that the first substrate extends beyond an edge of the second substrate. An IVH (Interstitial Via Hole) penetrates the base substrate.

29 Claims, 17 Drawing Sheets

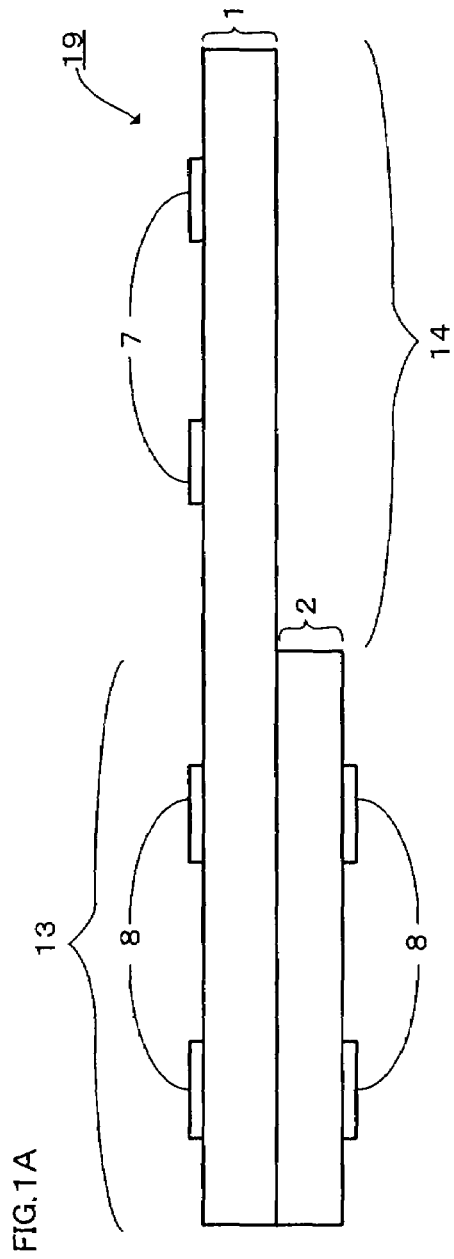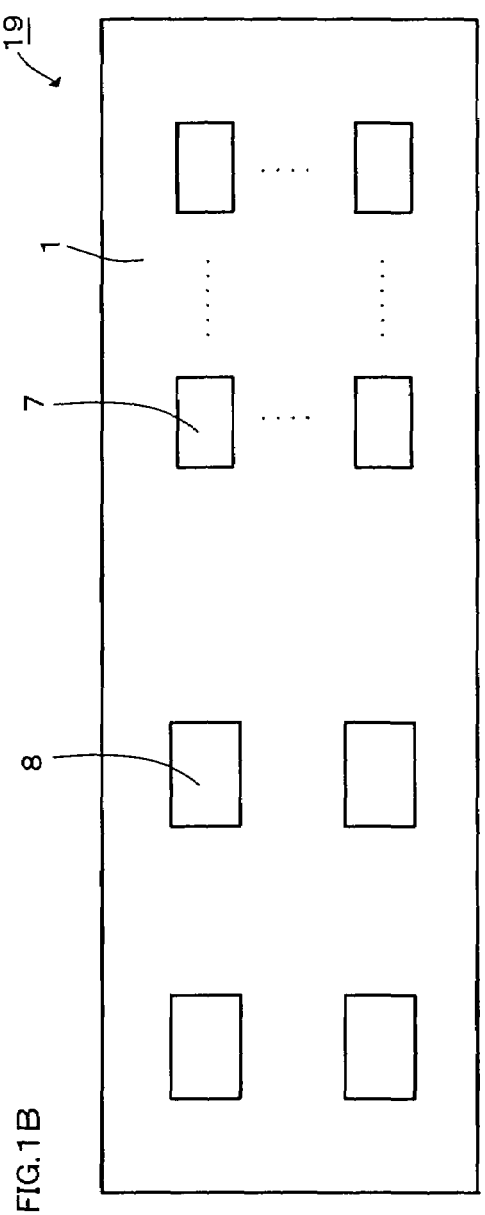

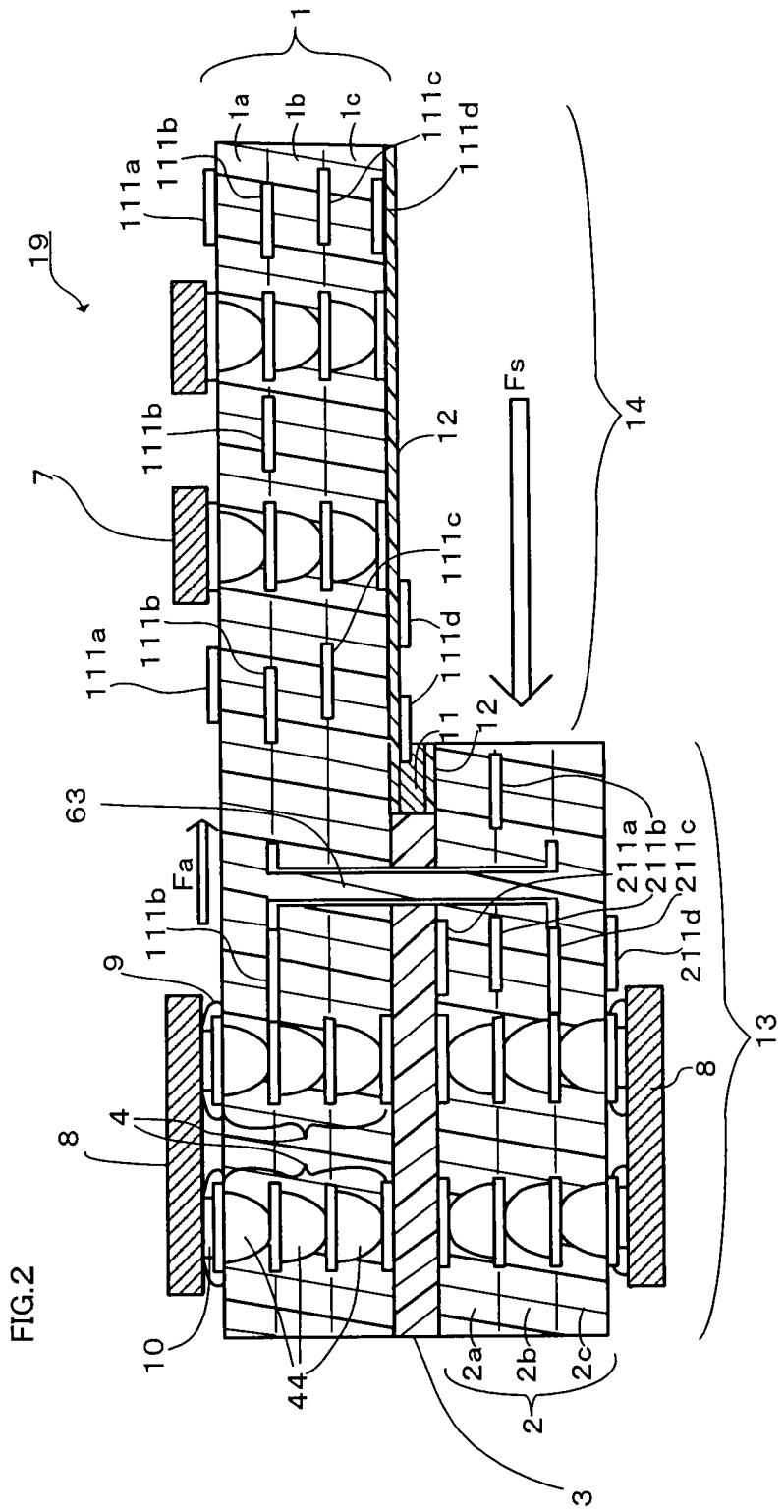

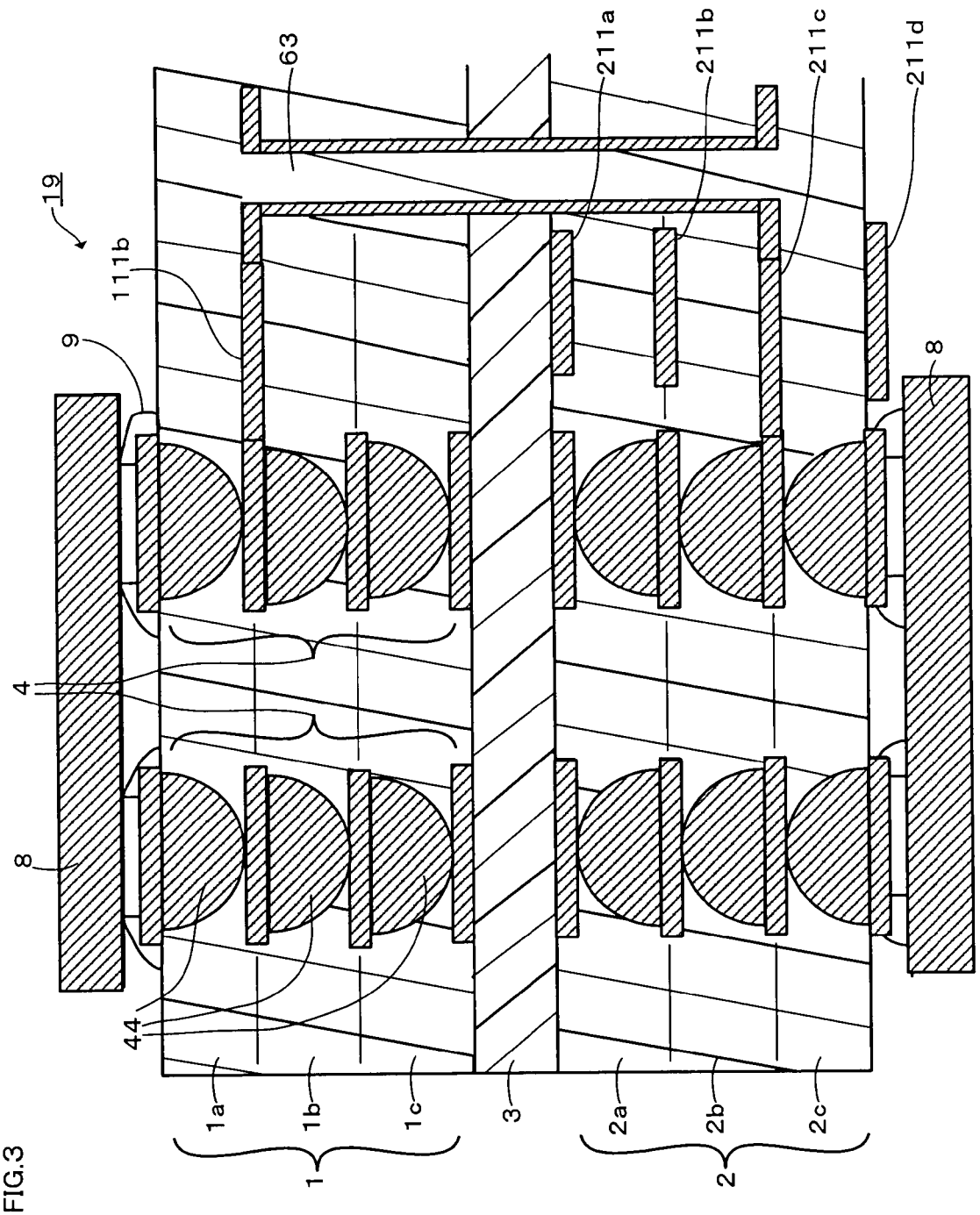

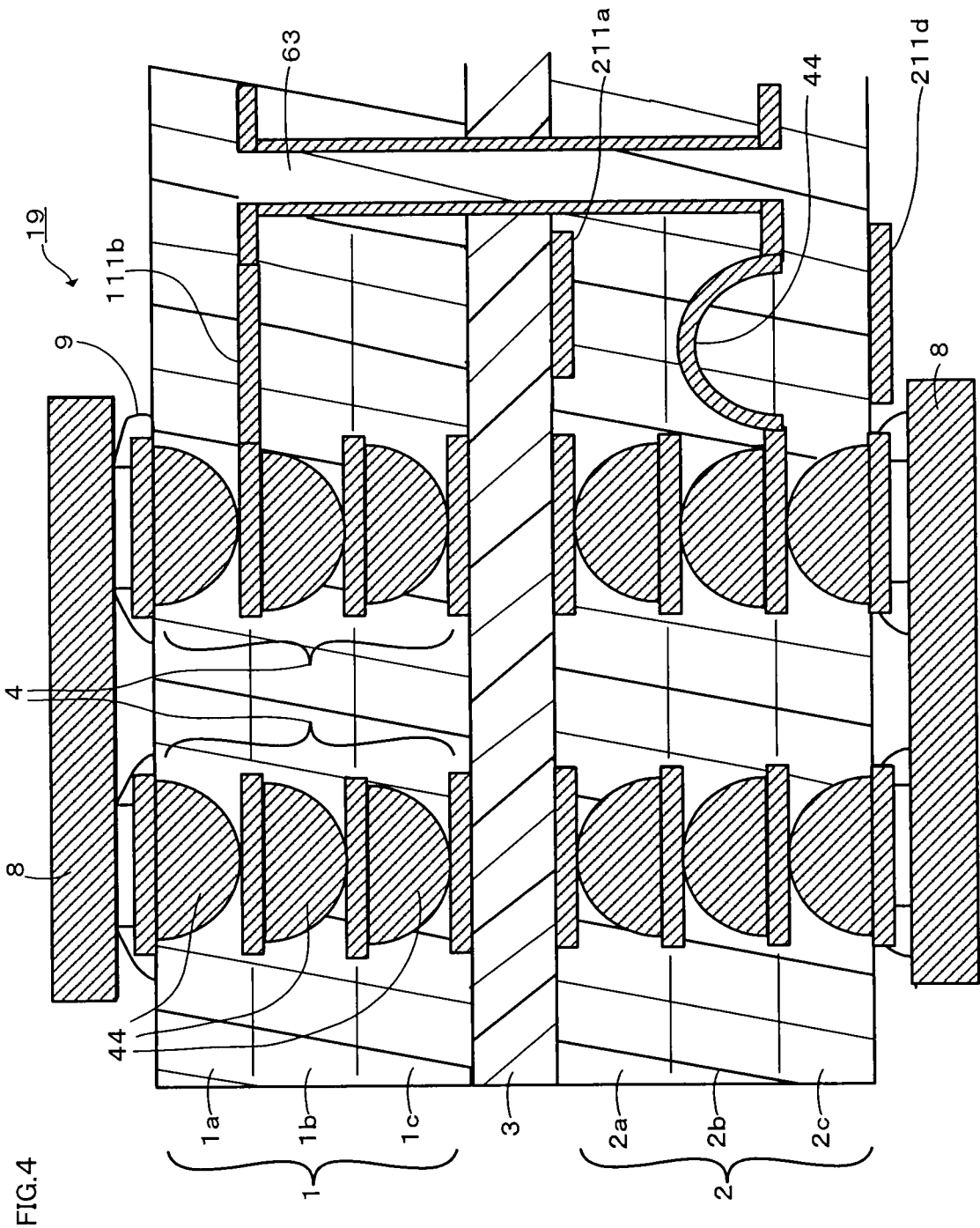

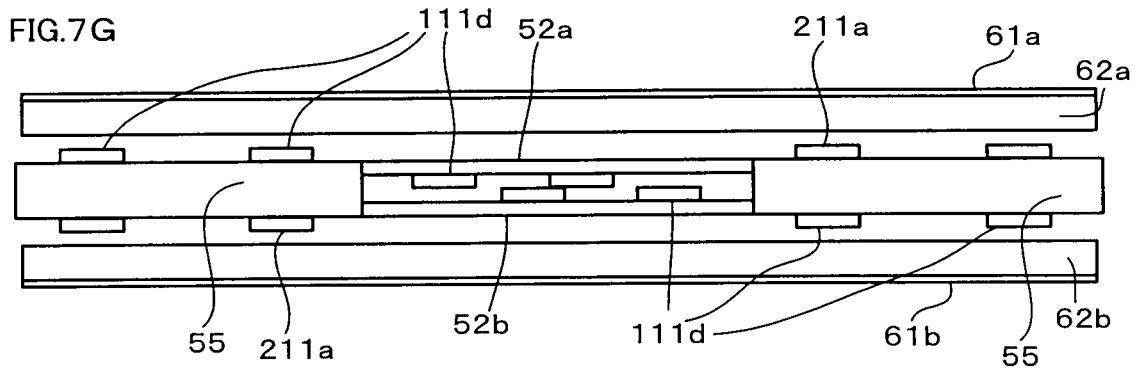
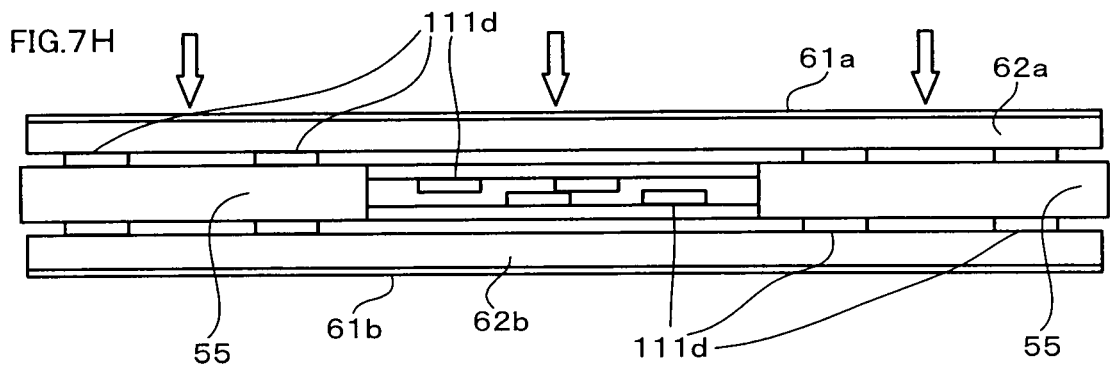
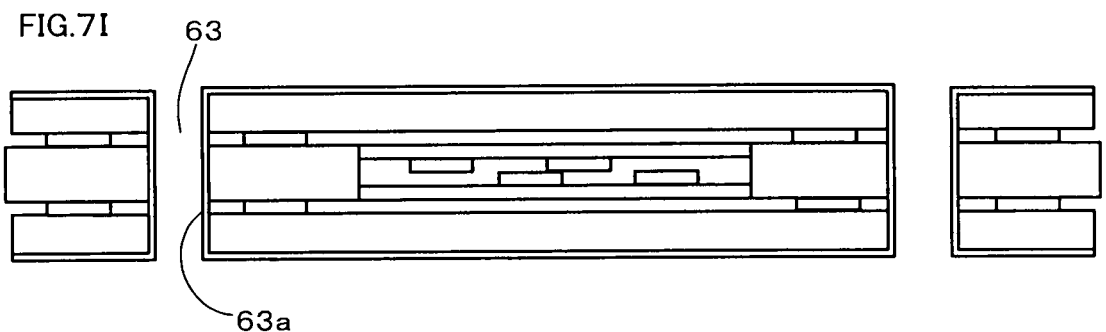
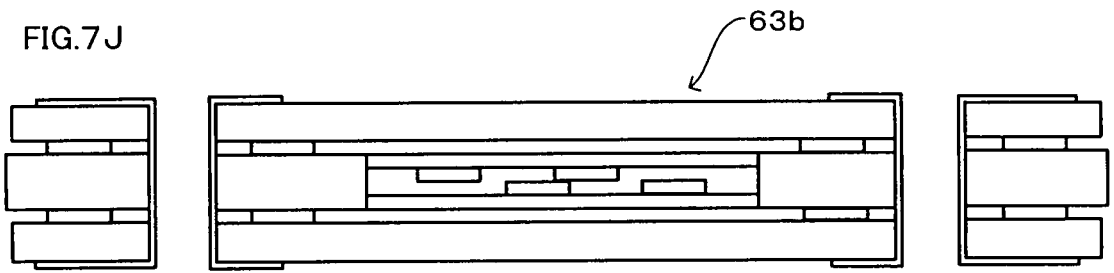

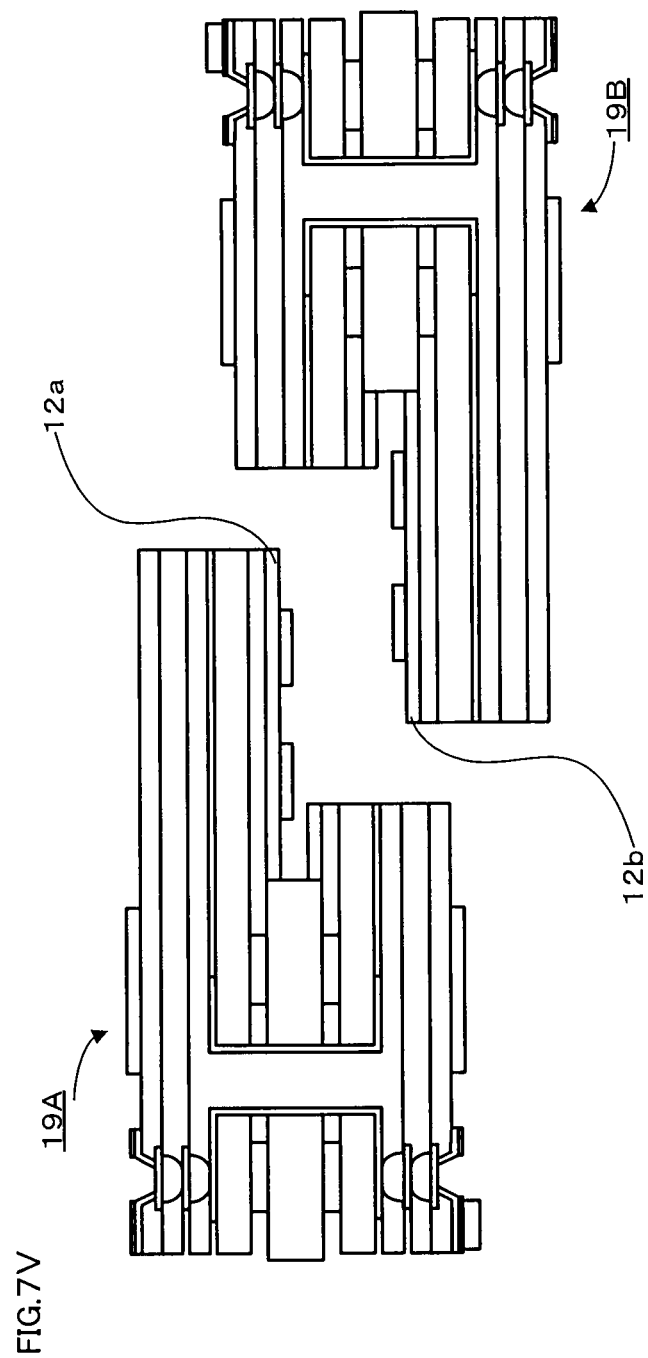

US 8,648,263 B2

WIRING BOARD AND METHOD OF MANUFACTURING WIRING BOARD

RELATED APPLICATION

This application claims the benefit of U.S. Provisional Application Ser. No. 60/938,596, filed May 17, 2007, the entire content of which is incorporated herein by reference.

FIELD OF TECHNOLOGY

The present invention relates to a wiring board formed by combining at least two boards each having a different mounting area, and a method of manufacturing such a wiring board.

DESCRIPTION OF RELATED ART

Japanese Unexamined Patent Publication H5-152693 discloses technology to solve insufficient rigidity in a wiring board. The technology relates to a wiring board having a reinforced section formed by making an extended portion of a flexible substrate, and folding the extended portion.

Further, technology to provide wiring structures with high flexibility is described, for example, in WO 05/029934. This publication discloses a printed wiring board having a first substrate with a second substrate laminated on the first substrate, where the contour of the second substrate is different from the contour of the first substrate. The entire content of each of H5-152693 and WO 05/029934 is incorporated herein by reference.

SUMMARY OF THE INVENTION

According to one embodiment, a wiring board includes a first substrate, a second substrate having a smaller mounting area than that of the first substrate, and a base substrate laminated between the first substrate and the second substrate such that the first substrate extends beyond an edge of the second substrate. An IVH (Interstitial Via Hole) penetrates the base substrate.

According to another embodiment, a method of manufacturing a wiring board includes forming a first insulation layer on a first surface of the base substrate and a second insulating layer on a second surface of the substrate opposing the first surface, and forming an IVH (Interstitial Via Hole) that penetrates the base substrate. Also included is cutting the first insulating layer in a first area and cutting the second insulating layer in a second area offset from said first area to form a first substrate laminated to a second substrate with the base layer interposed there between. The second substrate has a smaller mounting area than that of the first substrate such that the first substrate extends beyond an edge of the second substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1A is a side view illustrating a wiring board according to an embodiment of the present invention.

FIG. 1B is a plan view illustrating a wiring board according to an embodiment of the present invention.

FIG. 2 is a cross-sectional view illustrating a wiring board according to an embodiment of the present invention.

FIG. 3 is a cross-sectional view illustrating a wiring board according to an embodiment of the present invention.

FIG. 4 is a cross-sectional view illustrating a wiring board according to an embodiment of the present invention.

FIG. 7G is an illustration to describe a manufacturing step of a wiring board according to an embodiment of the present invention.

FIG. 7H is an illustration to describe a manufacturing step of a wiring board according to an embodiment of the present invention.

FIG. 7I is an illustration to describe a manufacturing step of a wiring board according to an embodiment of the present invention.

FIG. 7J is an illustration to describe a manufacturing step of a wiring board according to an embodiment of the present invention.

FIG. 7V is an illustration to describe a manufacturing step of a wiring board according to an embodiment of the present invention.

DETAILED DESCRIPTION

Figure 5:
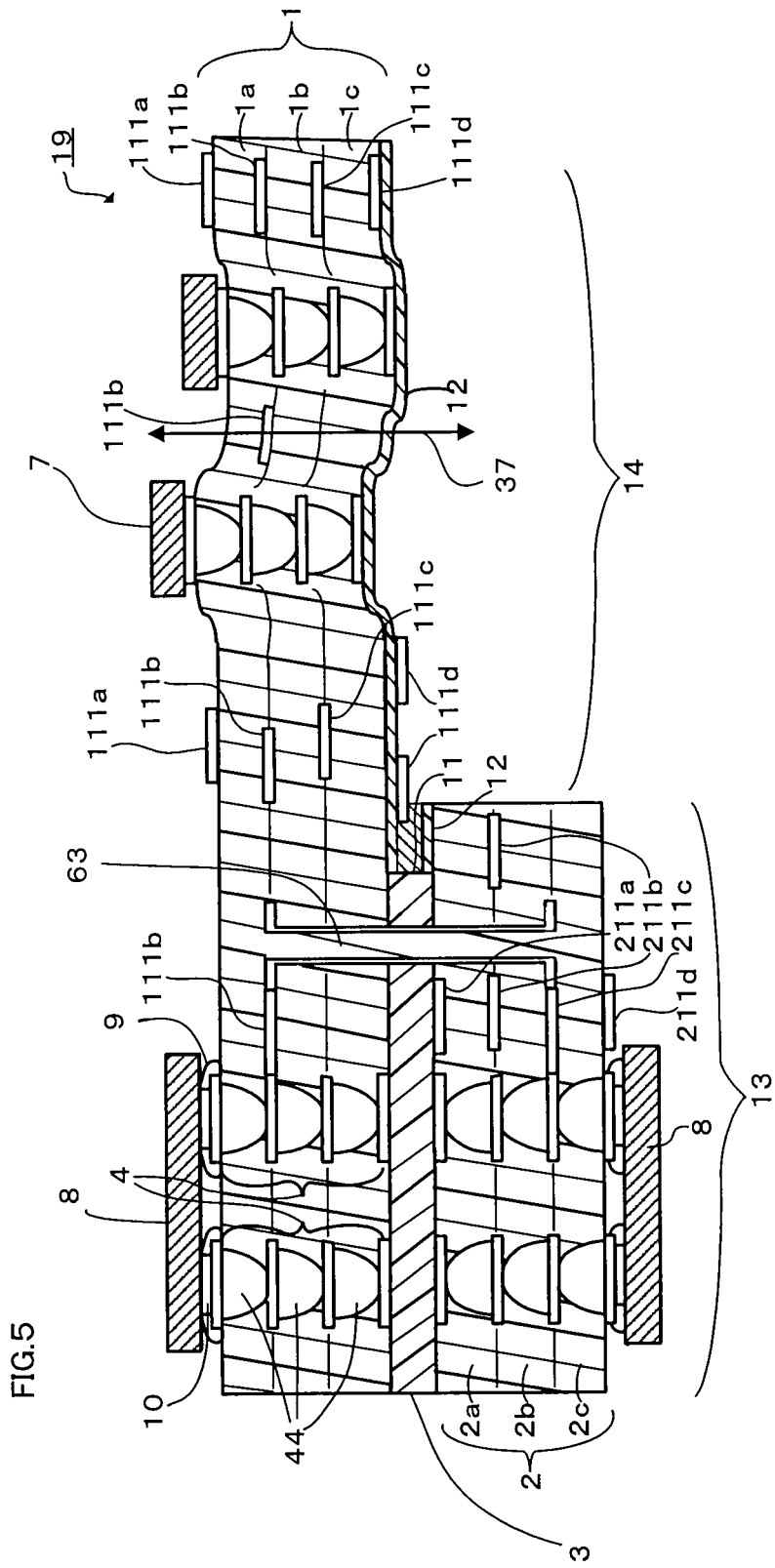
FIG. 5 is a cross-sectional view illustrating a wiring board according to an embodiment of the present invention.

In the following, an embodiment of a wiring board according to a specific example of the present invention is described with reference to the drawings.

As shown in FIG. 1A, wiring board 19 according to a specific example of the present invention has a different thickness on one edge from that on the other edge. The number of layers in the section having a different thickness (thicker section) differs from the number of layers in the thinner section. Namely, wiring board 19 has thick multi-layer section 13 and a relatively thin fewer-layer section 14. Multi-layer section 13 is formed by laminating two layers; first substrate 1 and second substrate 2. Fewer-layer section 14 has first substrate 1 which is extended from multi-layer section 13. Thus, as used herein, the term "multi-layer section" means 2 or more layers or boards, while the term "fewer layer section" means one or more layers or boards.

As shown in FIGS. 1A and 1B, first substrate 1 and second substrate 2 have the same width and different lengths, and one end of first substrate 1 and one end of second substrate 2 are aligned. First substrate 1 and second substrate 2 are each made of non-pliable base material such as epoxy resin.

On the surfaces (mounting surfaces) of first substrate 1 and second substrate 2, connecting pads to connect electronic components are formed; on the surfaces (mounting surfaces) and inner surfaces of first substrate 1 and second substrate 2, wiring patterns to structure electrical circuits are formed.

On the mounting surfaces of first substrate 1 and second substrate 2, electronic components 7, 8 are arranged and connected to connecting pads according to their requirements. Electronic components 7, 8 are connected with each other through connecting pads and wiring patterns.

Wiring board 19 is placed, for example, in the casing of a cell phone device. In such a circumstance, electronic component 7 placed in fewer-layer section 14 is structured, for example, with the keypad of a keyboard; and electronic component 8 placed in multi-layer section 13 is structured with an electronic chip, IC module, functional components and others. Also, in the step portion formed by multi-layer section 13 and fewer-layer section 14, for example, a thin-type battery is placed.

Next, a detailed structure of wiring board 19 having the above overall structure is described in reference to FIG. 2. As illustrated, first substrate 1 and second substrate 2 are laminated by sandwiching base substrate 3 between them. One end (the left end as illustrated in the drawing) of base substrate 3 is made to be flush with first substrate 1 and second substrate 2. Base substrate 3 is made of a highly rigid material such as glass epoxy resin. Base substrate 3 is made 50-100 µm, preferably about 100 µm.

Base substrate 3 is formed to be shorter than second substrate 2, and between first substrate 1 and second substrate 2, groove (hereinafter referred to as "interlayer groove portion") 11 is formed. Interlayer groove portion 11 is an aperture. The groove may be filled with elastic material such as silicon gel and silicon oil or viscous material or others. When wiring board 19 receives an impact from being dropped, the groove aperture or silicon gel or silicon oil that is filled in the interior portion of the groove cushions the impact as a shock-absorbing layer. Therefore, by being structured as such, tolerance to impact from being dropped may be improved.

First substrate 1 has a structure of laminated multiple insulation layers (1a, 1b, 1c). Each insulation layer is made of epoxy resin or the like with a thickness approximately 10 µm-60 µm. On the upper surface of insulation layer (1a), between epoxy-resin layers (1a) and (1b), between insulation layers (1b) and (1c) and on the lower surface of insulation layer (1c), wiring patterns (111a, 111b, 111c, 111d) are each formed. Each wiring pattern (111a, 111b, 111c, 111d) electrically connects required portions inside the circuit substrate.

Second substrate 2 also has a structure of laminated multiple insulation layers (2a, 2b, 2c) made of epoxy resin or the like with a thickness of approximately 10 µm-60 µm. On the lower surface of insulation layer (2a), between epoxy-resin layers (2a) and (2b), between insulation layers (2b) and (2c) and on the upper surface of insulation layer (2c), wiring patterns (211a, 211b, 211c, 211d) are each formed. Each wiring pattern (211a, 211b, 211c, 211d) electrically connects required portions inside the circuit substrate.

On the exposed portion of the lower surface of first substrate 1 and the exposed portion of the upper surface of the second substrate, adhesion prevention layers 12 are formed as a protective insulation layer. At the step portion created when laminating first substrate 1 and second substrate 2, conductive pattern (111d) is formed. Also, to the right of conductive pattern (111d) formed at the step portion, another conductive pattern (111d) is formed.

Keypad 7 is placed on the conductive pattern formed on the surface of fewer-layer section 14. Further, using solder 9, electronic chip 8 is anchored and connected to wiring patterns and built-up via 4 through connecting pads 10. For solder 9, Sn/Ag/Cu may be used.

Moreover, through-hole 63 is formed, penetrating base substrate 3 and connecting wiring pattern (111b) of first substrate 1 to wiring pattern (211c) of second substrate 2. The inner surface of through-hole 63 is plated to electrically connect wiring patterns. The area enveloped by plated through-hole 63 may be filled with resin such as epoxy resin.

In first substrate 1 and second substrate 2, multiple built-up vias 4 are formed. Built-up vias 4 are structured by stacking vias 44 formed in each insulation layer (1a-1c, 2a-2c). Built-up vias 4 connect required portions of wiring patterns (111a-111d) and also connect required portions of wiring patterns (211 a-211d). On the inner surface of each via 44 forming built-up via 4, a conductive layer made of plated-copper or the like is formed. Thus, as used herein, the term via refers to an opening formed in a substrate such as the insulating layer. As shown in FIG. 3, the interior portion of each via 44 is filled with conductor such as copper. However, as shown in FIG. 4, the interior portion of via 44 (in the lower right portion of the drawing) may be filled with resin such as epoxy resin.

Wiring board 19 having the above structure, for example, transmits operational signals from keypad 7 to an IC chip through built-up vias 4, wiring patterns (1111a-111d) and through-hole 63, and the signals are then processed at the IC chip. By doing so, varieties of signal processing may be conducted.

Also, as described above, wiring board 19 is structured with multi-layer section 13 and fewer-layer section 14 and has a step portion. And at the lower portion of fewer-layer section 14, a large-volume component such as a cell-phone battery may be placed.

Base substrate 3 is made of highly rigid material such as glass-epoxy resin. Multi-layer section 13, because of base substrate 3 placed there, is highly rigid compared with fewer-layer section 14. On the other hand, fewer-layer section 14 is relatively flexible compared with multi-layer section 13. Thus, it is possible to place electronic components on either section 13 or 14 according to the reliability level they require.

Also, for example, when the electronic device is dropped and an impact or the like is exerted on wiring board 19, due to the relative flexibility of fewer-layer section 14 compared with multi-layer section 13, fewer-layer section 14 vibrates as shown by arrow 37 in FIG. 5. Since portions of fewer-layer section 14 vibrate, the impact from being dropped or the like is converted to vibration movement energy, and the impact is absorbed accordingly. As a result, the wiring connecting the electronic components mounted on wiring board 19 may seldom rupture.

Also, built-up via 4 is structured as a stacked via made by laminating multiple vias 44. By making such a stacked interlayer connection structure, the wiring length may be shortened, and thus preferable for mounting electronic components requiring large amount of electricity.

Figure 6:
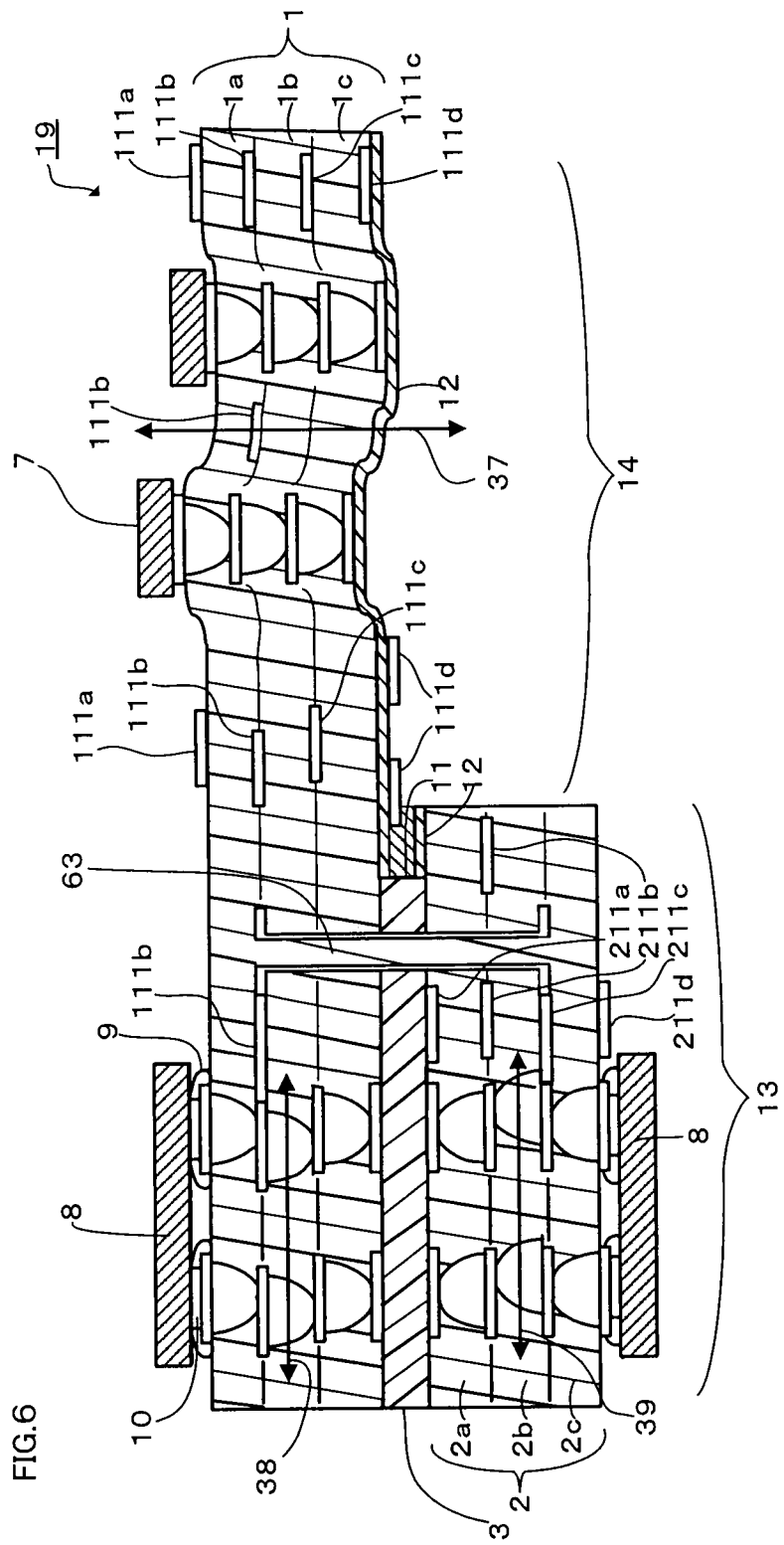
FIG. 6 is a cross-sectional view illustrating a wiring board according to an embodiment of the present invention.

Moreover, built-up via 4 has a certain degree of mobility. Therefore, for example, when the electronic device is dropped and an impact is exerted on wiring board 19, the impact may be absorbed at built-up via 4 through the movement of built-up via 4 as shown by arrows 38, 39 in FIG. 6. As a result, the wiring connecting the electronic components mounted on wiring board 19 may seldom rupture.

In addition, if solid material or the like is filled in interlayer groove portion 11, when the impact of being dropped or the like is exerted on the wiring board, interlayer groove portion 11 cushions the impact as a shock-absorbing layer. Accordingly, when interlayer groove portion 11 is formed, by improving tolerance to impact from being dropped, the wiring connecting the electronic components mounted on the wiring board may seldom rupture.

Also, in certain circumstances, two wiring boards of the present invention may be combined and sold in such a way that each fewer-layer section 14 is closely placed to provide compact shipment of the boards as will be further discussed with respect to FIG. 7V below. Here, if a wiring pattern is formed at the step portion created when first substrate 1 and second substrate 2 are laminated, in the circumstance when a user such as a device manufacturer uses the combined wiring boards of the present invention separately, warping of the wiring boards may be prevented. Namely, multi-layer section 13, because of base substrate 3 deposited there, is rigid compared with fewer-layer section 14. Thus, when a user separates the combined wiring boards of the present invention, warping does not occur at multi-layer section 13. On the other hand, fewer-layer section 14 is flexible compared with multi-layer section 13. Thus, when a user separates the combined wiring boards of the present invention, warping could possibly occur at fewer-layer section 14, especially at the step portion of fewer-layer section 14 created when first substrate 1 and second substrate 2 are laminated. However, if a wiring pattern is formed at the step portion, even when a user or the like uses the combined wiring boards of the present invention separately, warping may be prevented.

In the following, a method of manufacturing wiring board 19 according to the present invention is described.

Figure 7A:
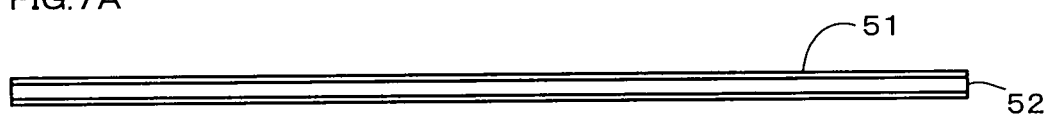
FIG. 7A is an illustration to describe a manufacturing step of a wiring board according to an embodiment of the present invention.

First, as shown in FIG. 7A, dummy core 52 which later forms adhesion prevention layer 12 is prepared. Dummy core 52 is, for example, formed with a C-stage epoxy resin. On dummy core 52, copper foil 51 is deposited.

Figure 7B:
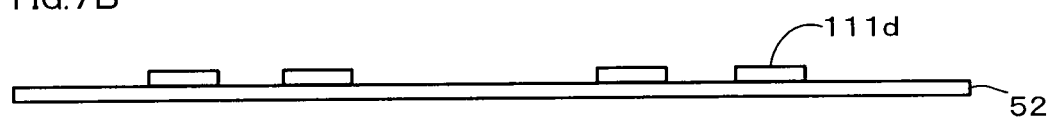
FIG. 7B is an illustration to describe a manufacturing step of a wiring board according to an embodiment of the present invention.

Next, as shown in FIG. 7B, by patterning copper foil 51, conductive pattern (111d) is formed at a predetermined position.

Figure 7C:
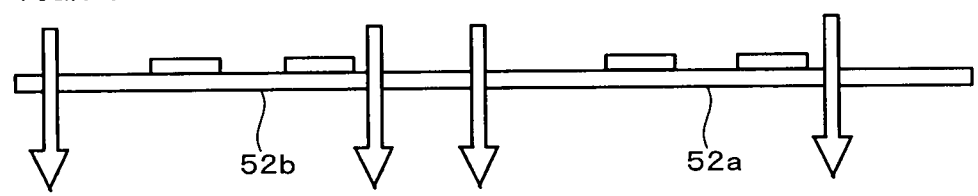
FIG. 7C is an illustration to describe a manufacturing step of a wiring board according to an embodiment of the present invention.

Then, as shown by arrows in FIG. 7C, dummy core 52 is cut by a laser or the like (represented by the arrows in FIG. 7C) to adjust its length to a length preferred for use in wiring board 19. As seen in FIG. 7C, the dummy core 52 is cut into dummy cores 52a and 52b, which will be used to form separate wiring boards as described below.

Figure 7D:
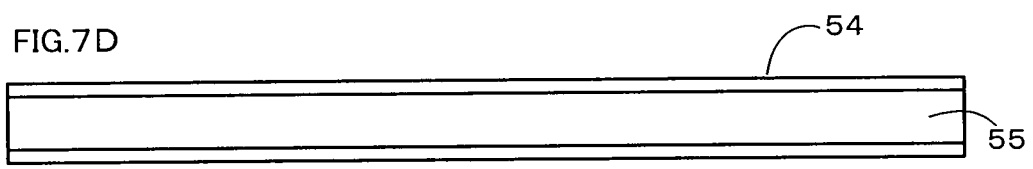
FIG. 7D is an illustration to describe a manufacturing step of a wiring board according to an embodiment of the present invention.

In addition, as shown in FIG. 7D, core 55, which later functions as base substrate 3, is prepared. Core 55 is made, for example, of highly rigid material such as glass-epoxy resin. On both surfaces of core 55, copper foil 54 is deposited.

Figure 7E:
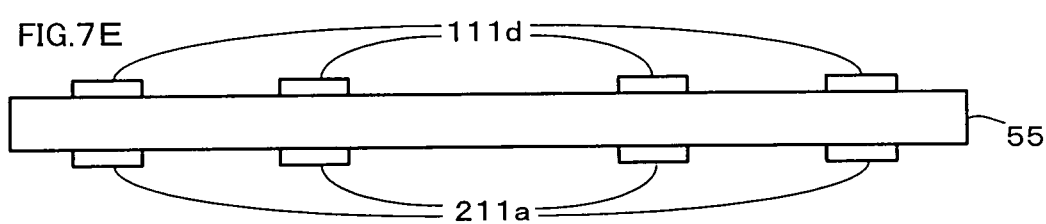
FIG. 7E is an illustration to describe a manufacturing step of a wiring board according to an embodiment of the present invention.

Next, as shown in FIG. 7E, by patterning copper foil 54, conductive patterns (111d, 211a) are formed to structure wiring patterns.

Figure 7F:
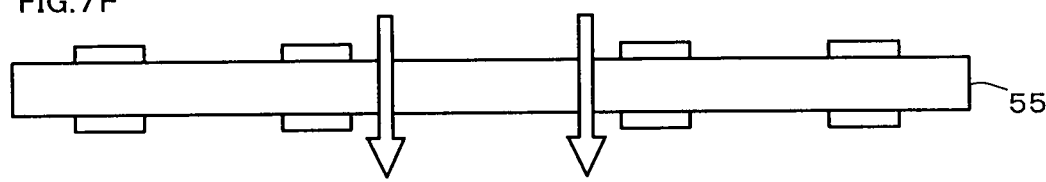
FIG. 7F is an illustration to describe a manufacturing step of a wiring board according to an embodiment of the present invention.

Next, as shown by an arrow in FIG. 7F, in core 55 using a laser or the like, a hole to insert dummy core 52 is formed.

Next, as shown in FIG. 7G, cut-out dummy cores (52a, 52b) are placed in such a way that conductive pattern (111d) are laminated facing inward. Then, laminated dummy cores (52a, 52b) and cut core 55 are horizontally connected. Further, on the top and bottom of dummy cores (52a, 52b) and core 55, prepreg (62a, 62b) are laminated. For prepreg (62a, 62b), low-flow prepreg impregnated with low-flow epoxy resin is preferred. Then, on the surfaces of prepreg (62a, 62b), copper foils (61a, 61b) are deposited.

Next, as shown in FIG. 7H, the laminated layers shown in FIG. 7G are pressure-pressed as represented by the arrows in FIG. 7H. Pressure pressing is, for example, conducted by hydraulic power using hydraulic pressing equipment under conditions calling for temperature of 200° C., pressure of 40 kgf and pressing time of three (3) hours. By doing so, resin leaks from the prepreg, and the prepreg (62a, 62b) and core material 55 will be integrated. At this time, since dummy core 52 is made of a C-stage epoxy resin, the materials in dummy cores (52a, 52b) are not integrated with each other. For pressure pressing, vacuum pressing may be employed instead of hydraulic pressing. By vacuum pressing, bubbles may be prevented from being mixed into the resin that structures the insulation layers. Vacuum pressing is conducted, for example, for an hour. Peak heating temperature is set, for example, at 175° C.; and vacuum-pressing pressure is set, for example, at $3.90 \times 10^6$ [Pa].

Next, in the laminated layer shown in FIG. 7H, holes are bored using a drill. By doing so, as shown in FIG. 7I, through-holes 63 are formed. Further, plating 63a may be formed on an interior surface of the through-hole 63.

When forming an IVH (Interstitial Via Hole), a $CO_2$ laser beam is provided from $CO_2$ laser processing equipment to bore a hole in insulation layers. Then, at a via-forming step described later referring to FIG. 7M, vias may be stacked at both ends of the IVH. The term IVH means a conductive structure which is formed by a hole that penetrates a base substrate or insulating layers, for example, but does not penetrate through a multilayered printed board itself, and plating the hole to electrically connect two or more conductive layers. An IVH occupies a space required for a connection, and includes, for example, a blind via hole structure formed in an outer layer of a multilayered printed wiring board and a buried via hole structure formed in an inner layer of the multilayered printed wiring board.

Next, as shown in FIG. 7J, by removing the unnecessary portions of copper foil 61, an inner-layer pattern 63*b* is formed.

Figure 7K:
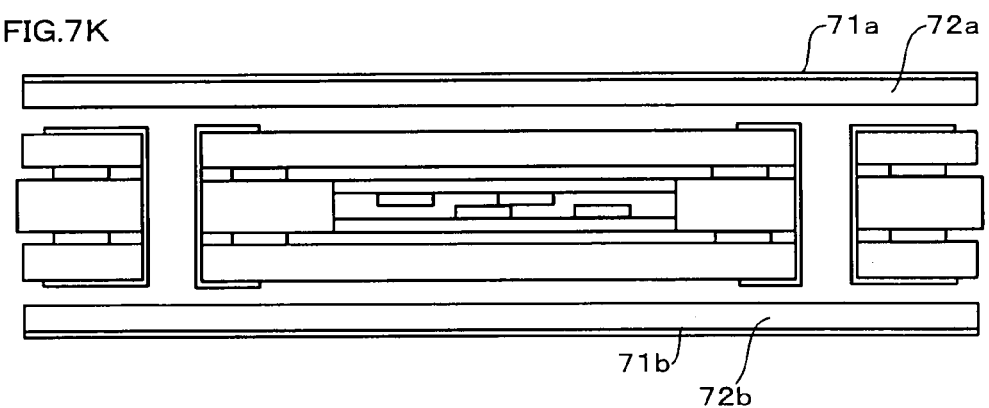
FIG. 7K is an illustration to describe a manufacturing step of a wiring board according to an embodiment of the present invention.

Next, as shown in FIG. 7K, epoxy resin (72*a*, 72*b*) is further laminated to form inner layers. On surfaces of epoxy resin (72*a*, 72*b*) copper foil (71*a*, 71*b*) is deposited.

Figure 7L:
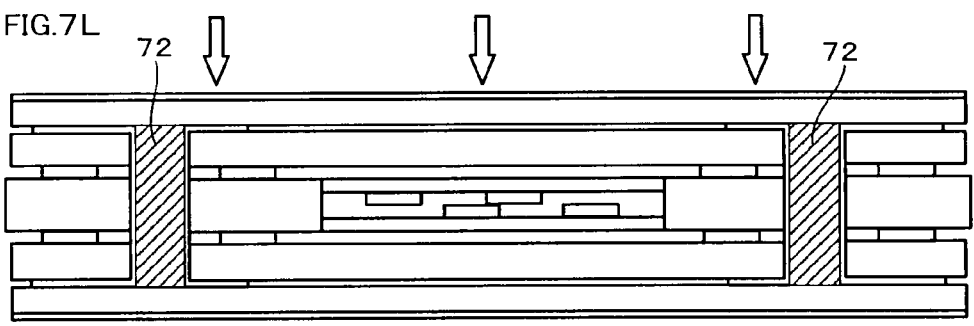
FIG. 7L is an illustration to describe a manufacturing step of a wiring board according to an embodiment of the present invention.

Next, as shown in FIG. 7L, after the lamination in reference to FIG. 7K, pressure pressing is conducted as represented by the arrows in FIG. 7L. Pressure pressing may be conducted, for example, by hydraulic power using hydraulic pressing equipment, or may be conducted by vacuum pressing. Portions of epoxy resin 72 are filled in through-holes 63.

Figure 7M:
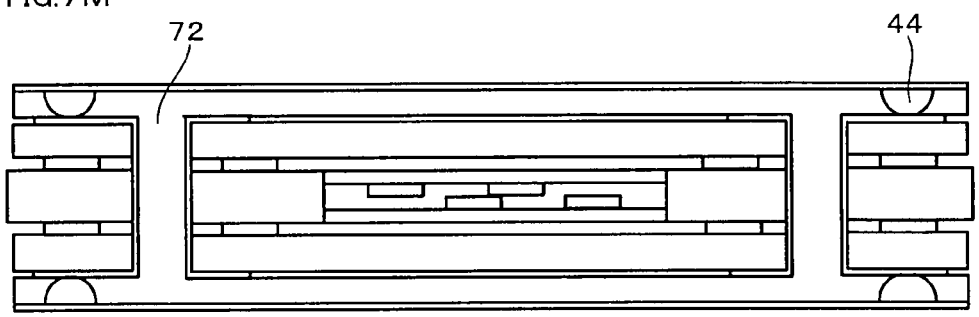
FIG. 7M is an illustration to describe a manufacturing step of a wiring board according to an embodiment of the present invention.

Next, as shown in FIG. 7M, vias 44 are formed. Namely, in epoxy resin (72*a*, 72*b*) made of insulation resin, via-hole openings are formed. Those openings may be formed by a laser beam. And, to remove resin residue remaining on the side and bottom surfaces of the openings formed by beaming a laser, a desmear treatment is preferably carried out. The desmear process is performed using an oxygen plasma discharge treatment, a corona discharge treatment, an ultra-violet laser treatment or an exima laser treatment. In the openings formed by the laser beam, for example, conductive material is filled to form filled-via holes. For conductive material, a conductive paste or metal plating formed by electrolytic plating process is preferred. For example, vias 44 are filled with conductor such as copper plating. To reduce the manufacturing cost and improve productivity by simplifying the filled-via forming step, filling with a conductive paste is preferred. For example, a conductive paste (such as thermo-set resin containing conductive particles) may be printed by screen-printing, filled in vias 44 and set. By filling the inner portion of vias 44 with the same conductive paste material, connection reliability when thermo-stress is exerted on vias 44 may be improved. On the other hand, regarding connection reliability, metal plating formed by an electrolytic plating process is preferred. Especially, electrolytic copper plating is preferred.

Figure 7N:
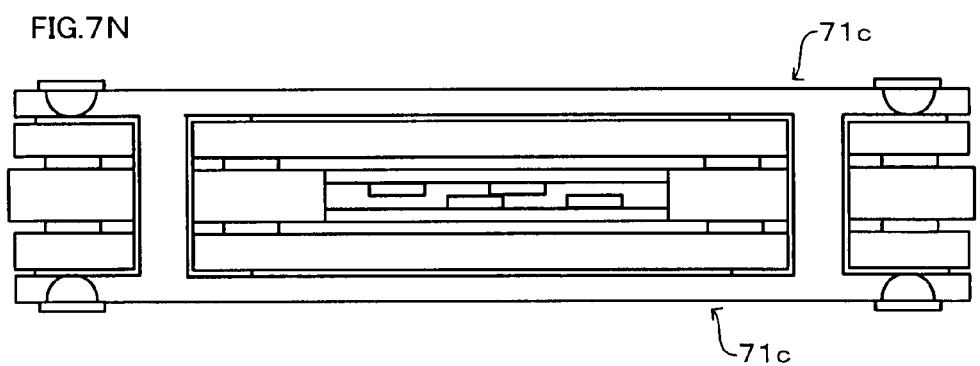
FIG. 7N is an illustration to describe a manufacturing step of a wiring board according to an embodiment of the present invention.

Next, as shown in FIG. 7N, by removing the unnecessary portions of copper foils 71, inner-layer patterns are formed.

Figure 7O:
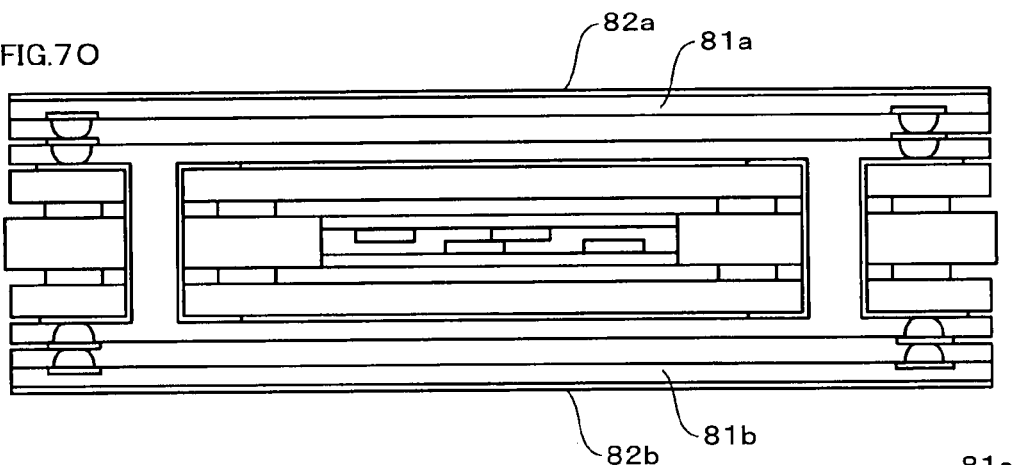
FIG. 7O is an illustration to describe a manufacturing step of a wiring board according to an embodiment of the present invention.

Next, as shown in FIG. 7O, after inner layers and vias are further formed, epoxy resin (81*a*, 81*b*) is laminated to form outer layers. On surfaces of epoxy resin (81*a*, 81*b*), copper foil (82*a*, 82*b*) is deposited. Here, a copper foil sheet with resin (Resin Copper Film: RCF) may be deposited and pressed.

Figure 7P:
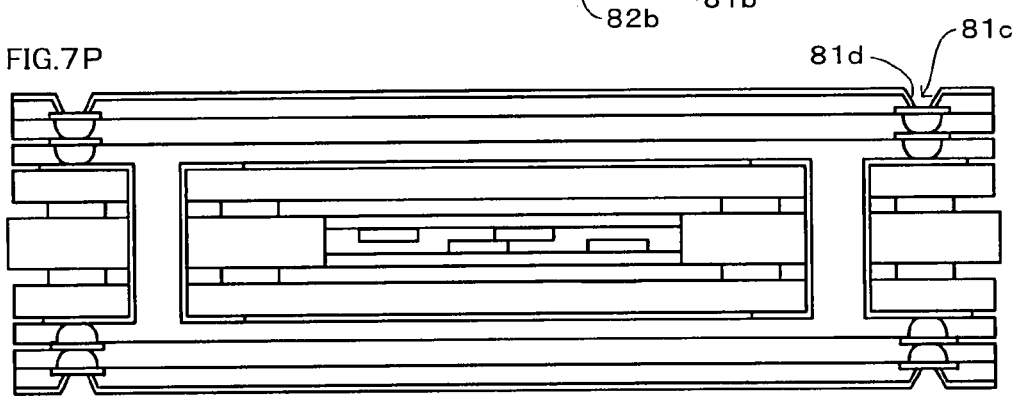
FIG. 7P is an illustration to describe a manufacturing step of a wiring board according to an embodiment of the present invention.
Figure 7Q:
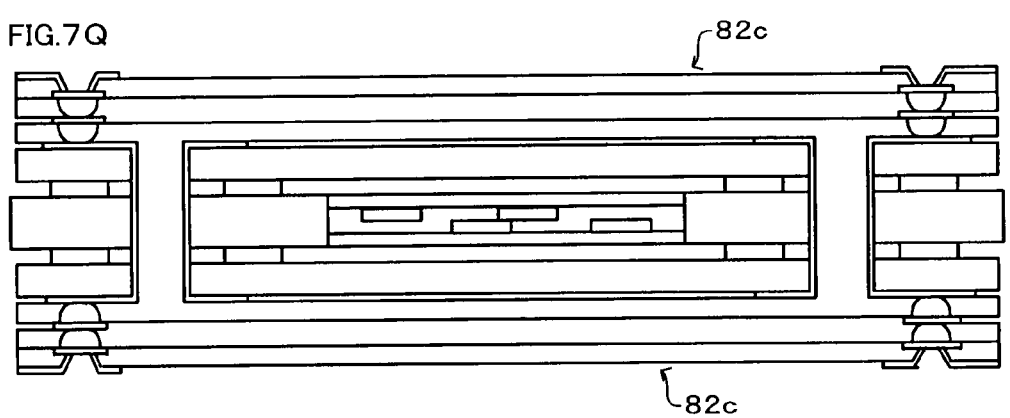
FIG. 7Q is an illustration to describe a manufacturing step of a wiring board according to an embodiment of the present invention.

Next, as shown in FIG. 7P, in the RCF, vias 81*c* are formed. Further, using copper plating or the like, the interior portions of the vias are filled with conductor 81*d*. Also, according to requirements, by patterning the surface copper foil, a conductive pattern is formed. Thus, as shown in FIG. 7Q, by removing the unnecessary portions of copper foils (82*a*, 82*b*), outer-layer patterns are formed.

Figure 7R:
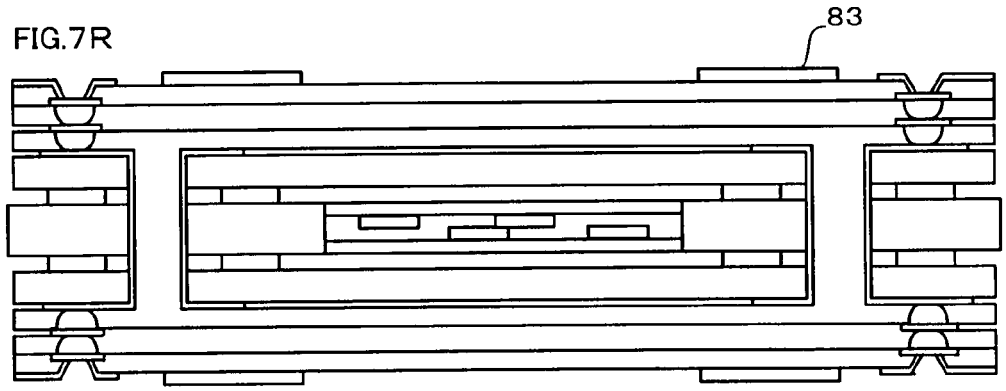
FIG. 7R is an illustration to describe a manufacturing step of a wiring board according to an embodiment of the present invention.

Next, as shown in FIG. 7R, solder-resists 83 are formed. Here, the solder resist indicates heat-resistant coating material, which is used when applying solder to cover the portions where the solder is to be kept from adhering. For solder-resist varieties, photo-setting type solder resist and thermo-setting type solder resist may be used. For a coating method, a screen-printing method or curtain-coating method may be used.

Figure 7S:
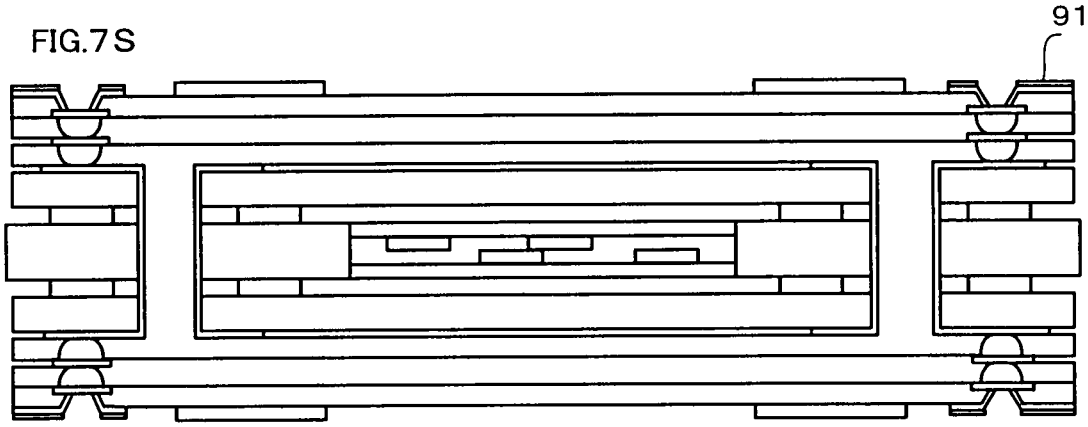
FIG. 7S is an illustration to describe a manufacturing step of a wiring board according to an embodiment of the present invention.

Next, as shown in FIG. 7S, to protect outer-layer patterns, gold plating 91 is performed by chemical plating. Other than chemical plating, methods such as fusion plating and electrical plating may be used. Moreover, materials other than gold plating, such as alloy plating for example may be used.

Figure 7T:
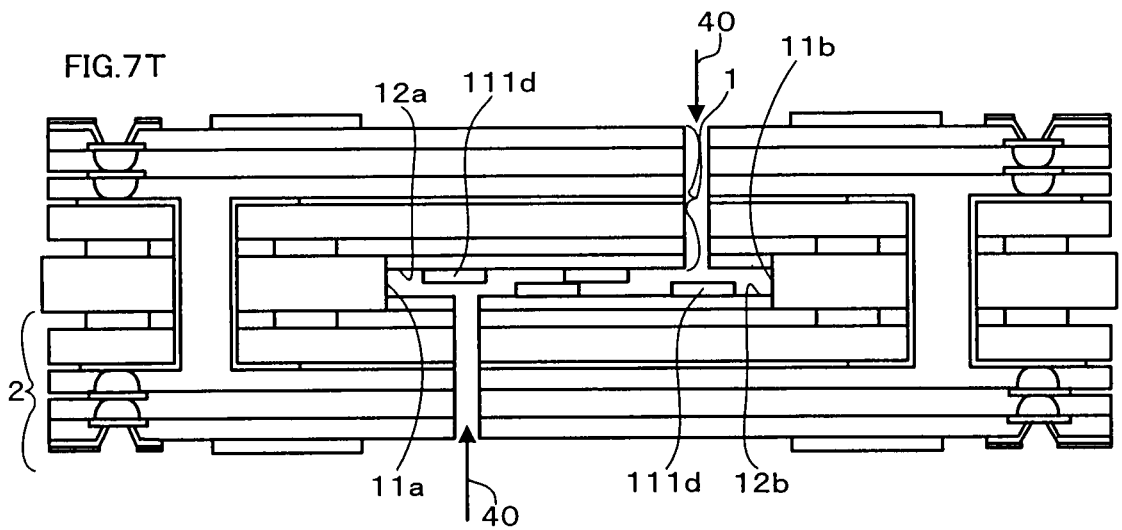
FIG. 7T is an illustration to describe a manufacturing step of a wiring board according to an embodiment of the present invention.

Next, as shown by arrows 40 in FIG. 7T, laser beams from laser processing equipment, for example $CO_2$ laser, are irradiated using conductive patterns (111*d*) as a stopper to cut insulation layers and the copper foil sheet with resin (RCF). Here, the thickness of conductive patterns (111*d*) is preferred to be made approximately 5-10 μm: if too thin, laser beams penetrate the pattern; and if too thick, conductive patterns with a fine line width are difficult to form.

Meanwhile, by laser cutting as shown in FIG. 7T, interlayer groove portions (11*a*, 11*b*) are also formed. Namely, by laser cutting, using adhesion prevention layer 12 formed in first substrate 1 and adhesion prevention layer (12*a*, 12*b*) formed in second substrate 2 as groove side-walls, and one surface of base substrate 3 as groove bottom, interlayer groove portions (11*a*, 11*b*) are formed.

Figure 7U:
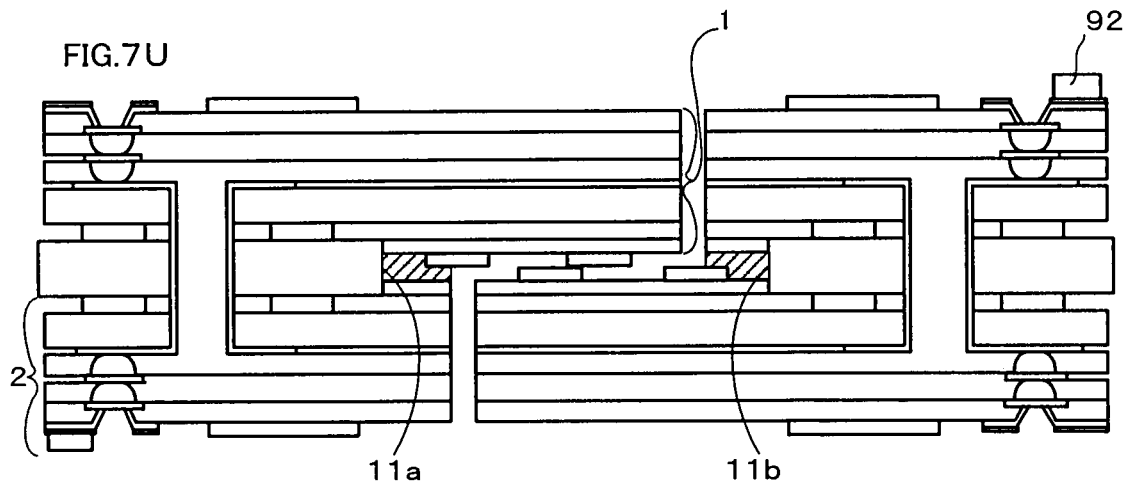
FIG. 7U is an illustration to describe a manufacturing step of a wiring board according to an embodiment of the present invention.

Lastly, as shown in FIG. 7U, electronic components 92 are mounted. Electronic components 92 are an electronic chip 8 and keypad 7. Further, in interlayer groove portions (11*a*, 11*b*), elastic material, viscous material or the like may be filled as depicted by the darkened portion shown in the interlayer groove portions in FIG. 7U.

Further, as shown in FIG. 7V, wiring board (19A) and wiring board (19B) are used separately. In such a circumstance, since adhesion prevention layers (12*a*, 12*b*) are formed, wiring board (19A) and wiring board (19B) may be separated by a simple process to be used separately. Regarding a wiring board according to the present invention, when an electronic device such as a cell phone receives an impact from being dropped or the like, connection breakage of electronic components or the like mounted in the wiring board may be prevented. Also, when being shipped to a user, the wiring board may be handled compactly, and when being used by the user, the combined wiring boards may be separated easily.

Figure 8:
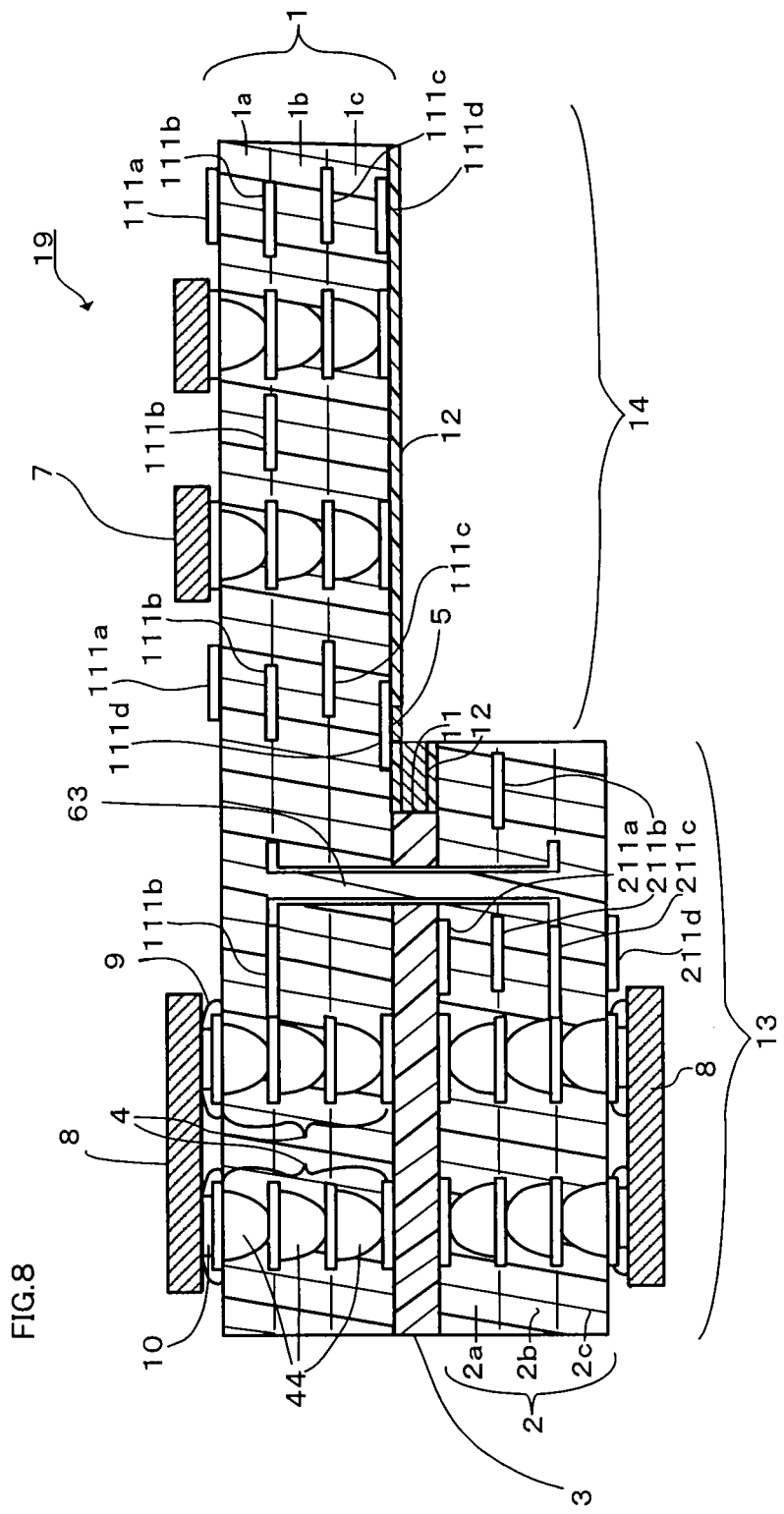
FIG. 8 is a cross-sectional view of a wiring board according to an embodiment of the present invention.

As shown in FIG. 8, in the Second Embodiment, at the portion where adhesion prevention layer 12 is made flush with the edge of second substrate 2, opening 5 is formed. Also in this embodiment wiring patterns 111*d* serving as stop layers are faced outward as will be further discussed below. The rest of the structure is the same as in the First Embodiment. Under opening 5, part of wiring pattern (111*d*) is positioned. Inside the groove formed with opening 5 and wiring pattern (111*d*) placed underneath is an aperture. The groove may be filled with elastic material such as silicon gel or silicon oil or viscous material. When wiring board 19 receives an impact from being dropped, the aperture inside the groove or silicon gel or silicon oil filled in the groove cushions the impact as a shock-absorbing layer. Therefore, by making such a structure, tolerance to impact from being dropped may be improved.

Also, if solid material or the like is filled in opening 5, the filled solid material or the like may play a role in decreasing warping at the juncture of multi-layer section 13 and fewer-layer section 14 where the number of layers is reduced. Accordingly, at the juncture of multi-layer section 13 and fewer-layer section 14, cracks may be prevented. Furthermore, if opening 5 is filled with, for example, solid material such as resin, the filled solid material plays a role in protecting conductive pattern (111d) mounted on first substrate 1. Therefore, tolerance to corrosion of conductive pattern (111d) may be improved.

Figure 9A:
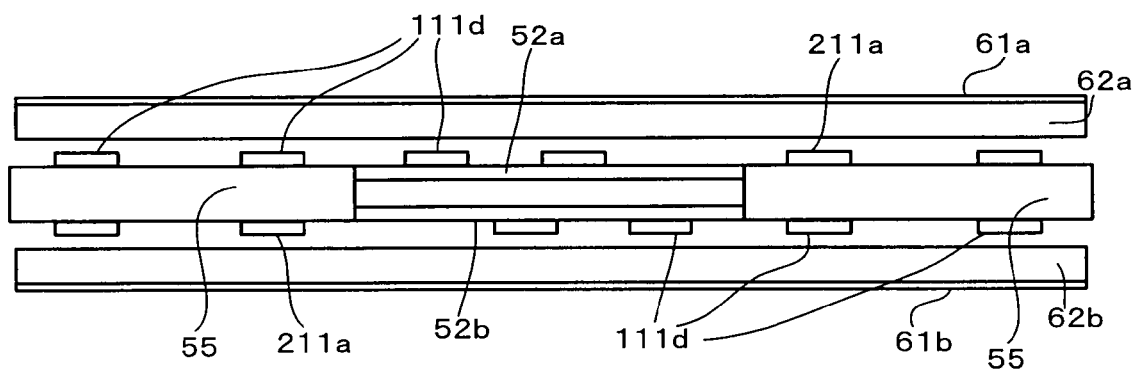
FIG. 9A is an illustration to describe a manufacturing step of a wiring board according to an embodiment of the present invention.
Figure 9B:
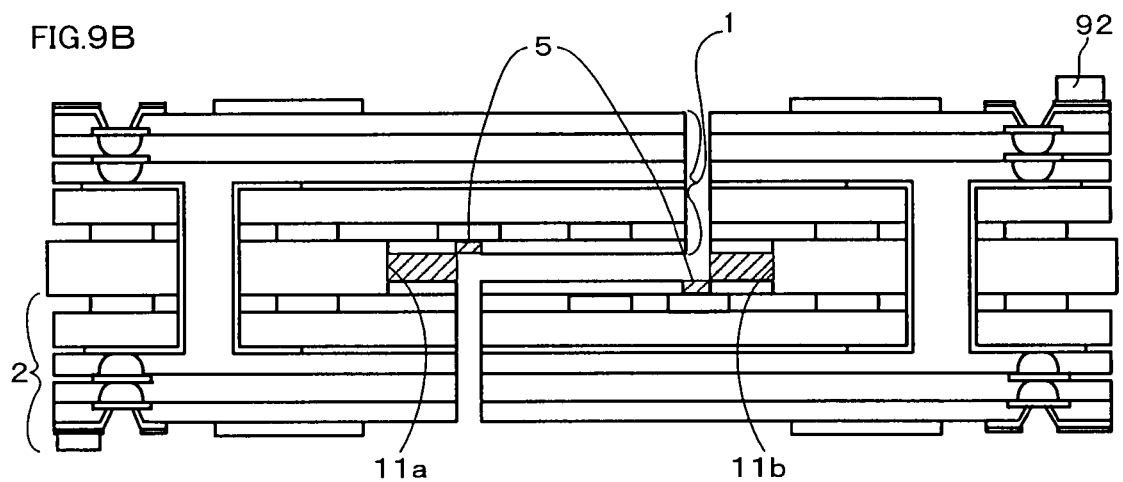
FIG. 9B is an illustration to describe a manufacturing step of a wiring board according to an embodiment of the present invention.

The method of manufacturing a wiring board according to the Second Embodiment is the same as the method of manufacturing a wiring board according to the First Embodiment in reference to FIGS. 7A-7F. However, FIG. 9A shows how the method of the second embodiment deviates from FIG. 7G of the first embodiment. As shown in FIG. 9A, cut-out dummy cores (52a, 52b) are placed in a way so that conductive pattern (111d) are laminated facing outward (rather than inward as shown in FIG. 7G). The method of the second embodiment then progresses in the same way as shown in FIGS. 7H-7T of the first embodiment. However, FIG. 9B shows how the method of the second embodiment deviates from FIG. 7U of the first embodiment. As shown in FIG. 9B, opening 5 is filled with viscous material such as silicon oil, for example. However, other materials may be provided in holes 5.

Figure 10:
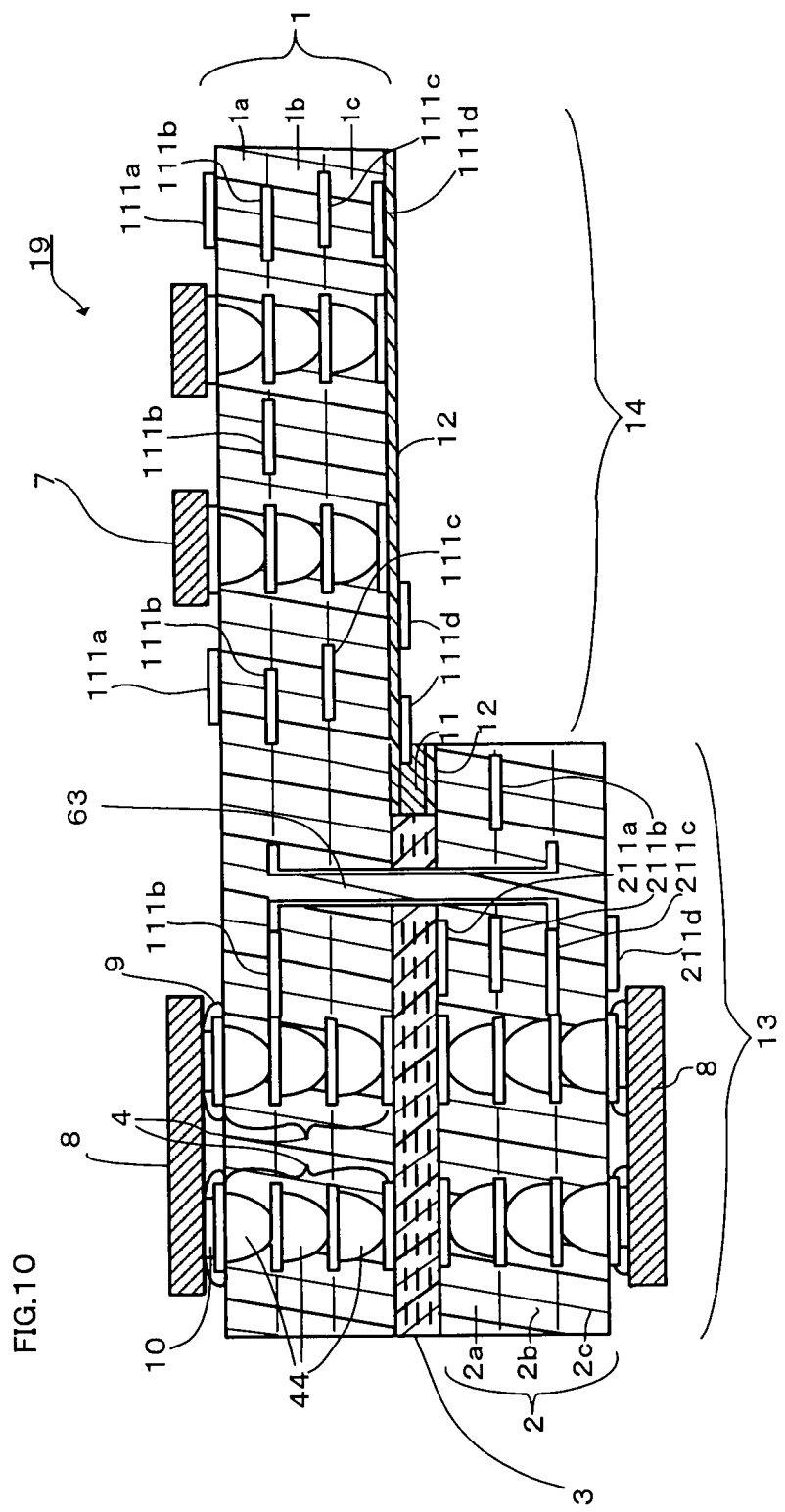
FIG. 10 is a cross-sectional view of a wiring board according to an embodiment of the present invention.

In the First Embodiment, base substrate 3 was made of glass-epoxy resin. However, as shown in FIG. 10, in the Third Embodiment, base substrate 3 is made containing base material of resin-impregnated inorganic fiber. By being structured as such, since base substrate 3 contains base material of resin-impregnated inorganic fiber, tolerance to warping may be improved.

The base material made of resin-impregnated inorganic fiber is formed by setting a prepreg. Prepreg is made by impregnating glass-cloth of inorganic fiber with epoxy resin, then preliminarily thermosetting the resin to advance the level of setting. The resin used to form the prepreg is preferred to have low-flow characteristics; however, those having regular flow characteristics may be used as well. Also, the prepreg may be formed by reducing the amount of epoxy-resin impregnated in the glass-cloth of inorganic fiber.

As for the inorganic fiber, it is not limited to glass-cloth, but for example, alumina fiber, carbon fiber (carbon fiber), silicon carbide fiber or silicon nitride fiber may be used. The method of manufacturing a wiring board according to the Third Embodiment is the same as that of FIGS. 7A-7U of the first embodiment except that, referring to FIG. 7D, as the material to form core 55, base material of resin-impregnated inorganic fiber is used. The rest of the process is the same as the method of manufacturing a wiring board according to the First Embodiment.

Figure 11:
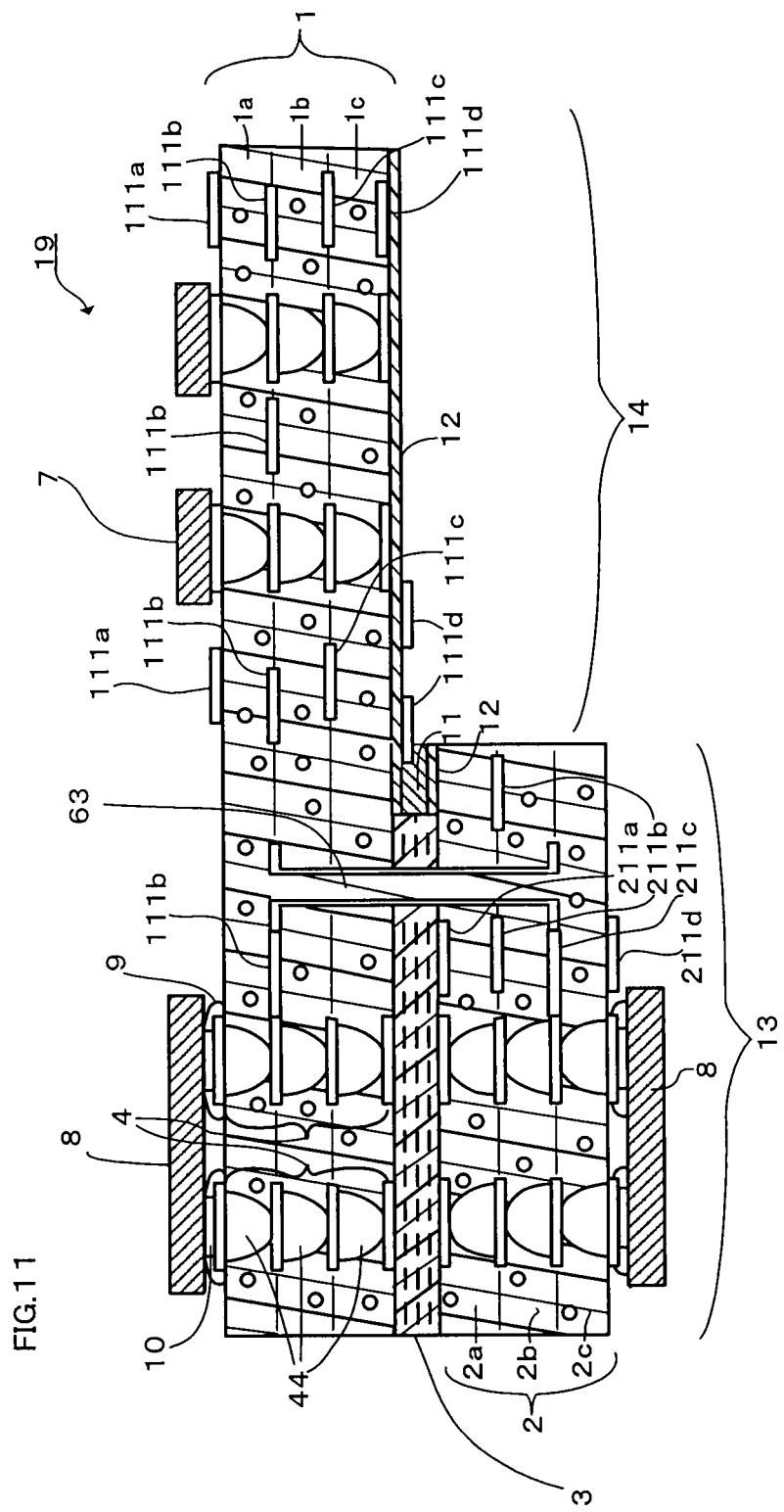
FIG. 11 is a cross-sectional view of a wiring board according to an embodiment of the present invention.

In the above-described First Embodiment, base substrate 3 was made of glass-epoxy resin. First substrate 1 and second substrate 2 are made of epoxy resin. However, the combination of material for base substrate 3 and material for first substrate 1 and second substrate 2 is not limited to the above. As shown in FIG. 11, in the Fourth Embodiment, base substrate 3 is made containing base material of resin-impregnated inorganic fiber; and first substrate 1 and second substrate 2 are made containing inorganic filler composite resin. By structuring such, since base substrate 3 contains base material of resin-impregnated inorganic fiber, tolerance to warping may be improved. Accordingly, when an electronic device such as a cell phone receives an impact from being dropped or the like, the wiring connecting electronic components mounted in the wiring board may seldom rupture.

An inorganic filler composite resin may be made by combining silica filler or glass filler with epoxy resin. In addition to epoxy resin, or other than epoxy resin, polyimide, polycarbonate, polybutylene-telephtarate or polyacrylate may be used.

For silica filler, fused silica ($SiO_2$) or crystalline silica ($SiO_2$) may be used. Also, for glass filler, aluminum oxide ($Al_2O_3$), magnesium oxide (MgO), or boron nitride (BN), aluminum nitride (AlN) may be used. Furthermore, for inorganic filler, it is not limited to silica filler or glass filler, but antimony trioxide, antimony pentaxide or magnesium hydroxide may be used.

The method of manufacturing a wiring board according to the Fourth Embodiment, referring to FIG. 7D, as the material to form core 55, a base material of resin-impregnated inorganic fiber is used. In addition, referring to FIGS. 7G, 7K and 7O, for the resin to be laminated, inorganic filler composite resin is used. The rest is the same as the method of manufacturing a wiring board according to the First Embodiment.

Figure 12:
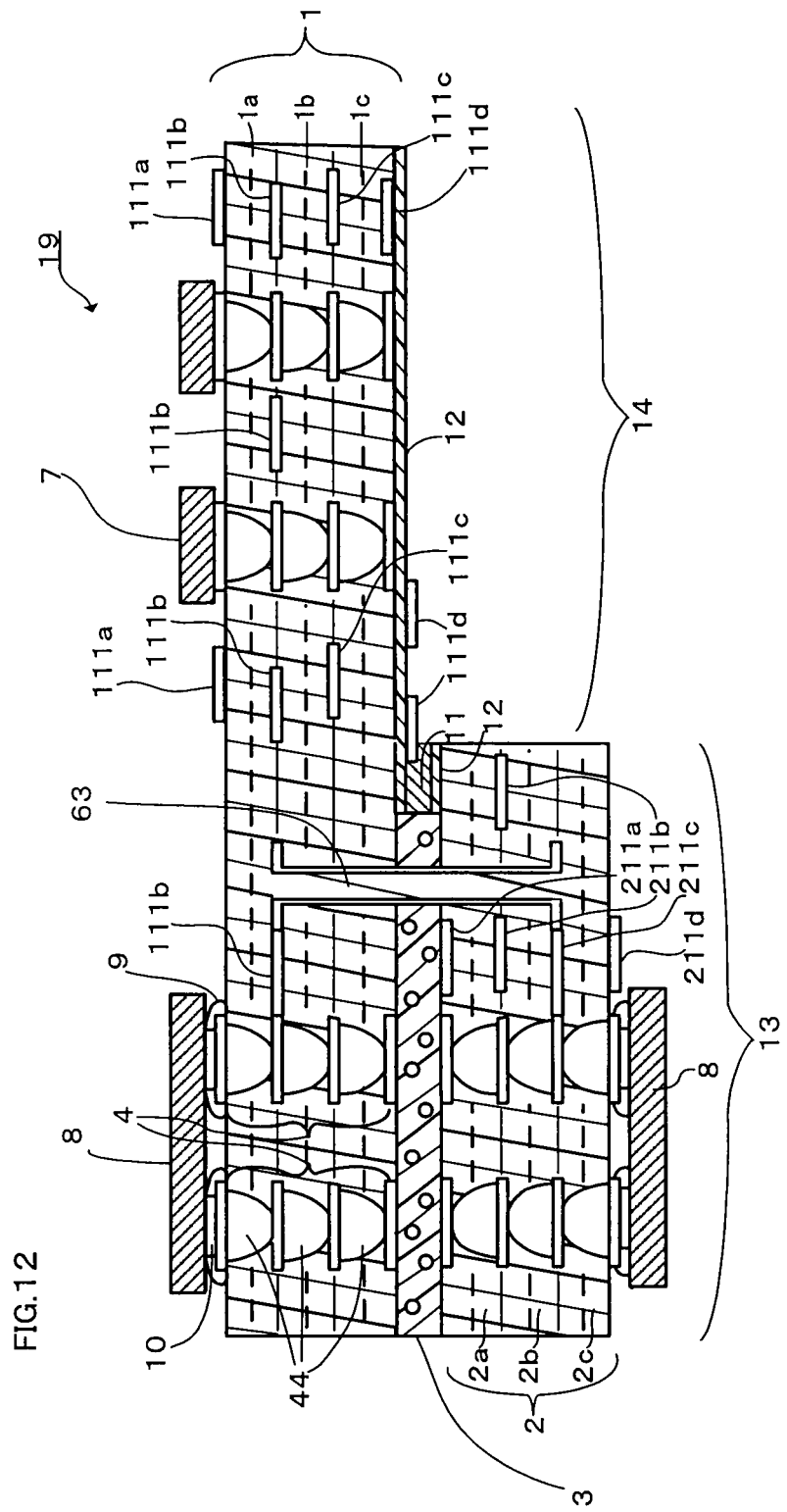
FIG. 12 is a cross-sectional view of a wiring board according to an embodiment of the present invention.

In the above-described First Embodiment, base substrate 3 is made of glass-epoxy resin. And first substrate 1 and second substrate 2 were made of epoxy resin. However, the combination of material for base substrate 3 and material for first substrate 1 and second substrate 2 is not limited to the above embodiment. As shown in FIG. 12, in the Fifth Embodiment, base substrate 3 is made containing inorganic filler composite resin; and first substrate 1 and second substrate 2 are made containing a base material of resin-impregnated inorganic fiber. By such structuring, since at least either first substrate 1 or second substrate 2 is reinforced with inorganic fiber, tolerance to warping may be improved. Accordingly, when an electronic device such as a cell phone receives an impact from being dropped or the like, the wiring connecting electronic components mounted in the wiring board may seldom rupture.

Above-described inorganic material such as inorganic fiber or inorganic filler has small thermo-expansion rates and low coefficient of elasticity compared with resin of an organic material. Therefore, when inorganic material such as inorganic fiber or inorganic filler is combined, alignment gaps between connecting lands may be reduced.

In the method of manufacturing a wiring board according to the Fifth Embodiment, referring to FIG. 7D, as the material to form core 55, inorganic filler composite resin is used. In addition, referring to FIGS. 7G, 7K and 7O, as the material to be laminated, base material of resin-impregnated inorganic fiber is used. The rest is the same as the method of manufacturing a wiring board according to the First Embodiment.

In a wiring board according to the First Embodiment of the present invention, first substrate 1 and second substrate 2 are in a stratum structure having a rectangular outline. However, they are not limited to such, but may be in a stratum structure having a circular, hexagonal, or octagonal outline.

Also, in the First Embodiment, first substrate 1 and second substrate 2 are made of epoxy resin. However, first substrate 1 and second substrate 2 are not limited to such, but may be made of polyimide, polycarbonate, polybutylene-telephtarate or polyacrylate. In addition, if first substrate 1 and second substrate 2 are made of epoxy resin, naphthalene-type epoxy resin, dicyclo-penta-diene-type epoxy resin, biphenyle-type epoxy resin or bisphenole-type epoxy resin may be used.

In the First Embodiment, as solder 9, Sn/Ag/Cu was used. However, solder 9 is not limited to such; solder containing antimony, tin, lead, indium or copper may be used. Also, eutectic crystal metals such as Sn/Sb, Sn/Ag, Sn/Pb or Sb/Cu may be used as well. Among such eutectic crystal metals, to avoid having a bad influence on the substrates, using those having relatively low melting temperatures, 250° C. or lower, is preferred.

In the First Embodiment, in interlayer groove portion 11, silicon gel of viscous silicon is filled. However, filling interlayer groove portion 11 is not limited to such, and solid material may also be used. As solid material to be filled in interlayer groove portion 11, high-polymer rubber is preferred as a solid material having viscosity and elasticity. Specifically, butyl-rubber, isoprene rubber, butadiene rubber, styrene-butadiene rubber or ethylene-propylene rubber may be used. Moreover, interlayer groove portion 11 may be filled with a gas. As the gas to be filled in interlayer groove portion 11, a rare gas such as argon, or nitrogen or oxygen may be used.

In the Second Embodiment, in opening 5, silicon gel of viscous silicon is filled. However, the material to be filled in opening 5 is not limited to such, but solid material may be filled in opening 5. As solid material to be filled in opening 5, high-polymer rubber as solid material having viscosity and elasticity is preferred. Specifically, butyl-rubber, isoprene rubber, butadiene rubber, styrene-butadiene rubber or ethylene-propylene rubber may be used. As the material to be filled in opening 5, a liquid or solid material is preferred, but a gas may also be filled. In such a case, as the gas to be filled in opening 5, a rare gas such as argon, or nitrogen or oxygen may be used.

In addition, first substrate 1 may not need to be formed single-layered, but may be formed multi-layered. Namely, first substrate 1 may be structured with a lower-layer insulation layer and an upper-layer insulation layer. Here, a lower-layer insulation layer indicates the insulation layer formed close to base substrate 3; and an upper-layer insulation layer indicates an insulation layer formed on the outer surface of the wiring board. Furthermore, first substrate 1 may be structured with a lower-layer insulation layer, an upper-layer insulation layer and an intermediate insulation layer placed in between. The intermediate insulation layer may be made multi-layered. In the First Embodiment, the lower-layer insulation layer corresponds to epoxy-resin layer ($1c$), the intermediate insulation layer corresponds to epoxy-resin layer ($1b$) and the upper-layer insulation layer corresponds to epoxy-resin layer ($1a$).

Also, the second substrate may not need to be formed single layered, but may be formed multi-layered. And second substrate 2 may also be structured with a lower-layer insulation layer and an upper-layer insulation layer. Furthermore, second substrate 2 may be structured with a lower-layer insulation layer, an upper-layer insulation layer and an intermediate insulation layer placed in between. In the First Embodiment, the lower-layer insulation layer corresponds to epoxy-resin layer ($2a$), the intermediate insulation layer corresponds to epoxy-resin layer ($2b$) and the upper-layer insulation layer corresponds to epoxy-resin layer ($2c$). On top of the upper-layer insulation layer and lower-layer insulation layer, conductive patterns are formed. And, those conductive patterns may be connected with each other through vias 44. The present invention may be employed in a wiring board which can mount electronic components, specifically, in a wiring board which can mount electronic components for a compact electronic device.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board comprising:
a first substrate;
a second substrate having a smaller mounting area than a mounting area of the first substrate;
a base substrate laminated between the first substrate and the second substrate such that the first substrate extends beyond an edge of the second substrate and the edge of the second substrate forms a step portion with respect to the first substrate; and
an Interstitial Via Hole structure penetrating through the base substrate,
wherein the first substrate and the second substrate are laminated to the base substrate such that the first substrate and the second substrate form a first end portion of the wiring board, the first substrate forms a second end portion of the wiring board on an opposite side of the first end portion of the wiring board, the second substrate does not form the second end portion of the wiring board, and the base substrate has an interlayer groove portion formed at the edge of the second substrate between the first substrate and the second substrate.

2. The wiring board according to claim 1, wherein the interlayer groove portion is filled with at least one of a gas, a liquid and a solid material.

3. The wiring board according to claim 1, further comprising a warping prevention portion formed at the step portion.

4. The wiring board according to claim 1, wherein:
the base substrate comprises a resin-impregnated inorganic fiber;
the first substrate comprises at least one of an inorganic filler composite resin and a pliable resin; and
the second substrate comprises at least one of an inorganic filler composite resin and a pliable resin.

5. The wiring board according to claim 4, wherein the resin-impregnated inorganic fiber comprises a glass cloth.

6. The wiring board according to claim 4, wherein at least one of the first substrate and the second substrate comprises the inorganic filler which comprises at least one of a silica filler and a glass filler.

7. The wiring board according to claim 1, wheren:
the base substrate comprises an inorganic filler composite resin; and
at least one of the first substrate and the second substrate comprises a base material of a resin-impregnated inorganic fiber.

8. The wiring board according to claim 7, wherein the resin-impregnated inorganic fiber comprises a glass cloth.

9. The wiring board according to claim 7, wherein the inorganic filler comprises at least one of a silica filler and a glass filler.

10. The wiring board according to claim 1, further comprising:
a conductive pattern formed on the first substrate; and
a conductive pattern formed on the second substrate,
wherein the conductive pattern on the first substrate and the conductive pattern on the second substrate are electrically connected by the Interstitial Via Hole structure.

11. The wiring board according to claim 1, further comprising:
a plurality of stacked vias formed in at least one of the first substrate and the second substrate; and
a conductive layer formed on an inner surface of at least one of said vias by plating,
wherein the at least one of the vias is filled with a metal.

12. The wiring board according to claim 1, further comprising:
a plurality of stacked vias formed in at least one of the first substrate and the second substrate; and
a conductive layer formed on an inner surface of at least one of said vias by plating,
wherein the at least one of the vias is filled with a resin.

13. The wiring board according to claim 1, wherein:

the first substrate includes a first lower-layer insulation layer and a first upper-layer insulation layer; and the second substrate includes a second lower-layer insulation layer and a second upper-layer insulation layer.

14. The wiring board according to claim 13, further comprising:

an upper conductive pattern formed on each of the upper-layer insulation layers; and a lower conductive pattern formed on each of the lower-layer insulation layers, wherein the upper conductive patterns on the upper-layer insulation layers are each connected to a respective conductive pattern of the lower conductive patterns on the lower-layer insulation layers through a stacked via.

15. A method of manufacturing a wiring board comprising:
forming a base substrate;
forming a first insulation layer structure on a first surface of the base substrate;
forming a second insulating layer structure on a second surface of the base substrate on the opposite side of the first surface of the base substrate;
forming an IVH penetrating through the base substrate;
cutting the first insulating layer structure through a first area of the first insulating layer structure and the second insulating layer structure through a second area of the second insulating layer structure offset from said first area such that a wiring board having a first substrate laminated to a second substrate with the base substrate interposed therebetween is formed; and
forming an interlayer groove portion in the base substrate at an edge of the second substrate between the first substrate and the second substrate,
wherein the second substrate has a smaller mounting area than a mounting area of the first substrate such that the first substrate extends beyond the edge of the second substrate and the edge of the second substrate forms a step portion with respect to the first substrate, the first substrate and the second substrate are laminated to the base substrate such that the first substrate and the second substrate form a first end portion of the wiring board, the first substrate forms a second end portion of the wiring board on an opposite side of the first end portion of the wiring board, and the second substrate does not form the second end portion of the wiring board.

16. The method of manufacturing a wiring board according to claim 15, further comprising:
filling the interlayer groove portion with at least one of a gas, a liquid and a solid material.

17. The method of manufacturing a wiring board according to claim 15, further comprising forming a warping prevention portion at the step portion.

18. The method of manufacturing a wiring board according to claim 15, further comprising:
forming an opening at the step portion; and
filling the opening with at least one of a gas, a liquid and a solid material.

19. The method of manufacturing a wiring board according to claim 15, wherein the base substrate comprises a resin-impregnated inorganic fiber, the first substrate comprises at least one of an inorganic filler composite resin and a pliable resin, and the second substrate comprises at least one of an inorganic filler composite resin and a pliable resin.

20. The method of manufacturing a wiring board according to claim 19, wherein the inorganic fiber comprises a glass cloth.

21. The method of manufacturing a wiring board according to claim 19, wherein at least one of the first substrate and the second substrate comprises the inorganic filler which comprises at least one of a silica filler and a glass filler.

22. The method of manufacturing a wiring board according to claim 15, wherein the base substrate comprises an inorganic filler composite resin, and at least one of the first substrate and the second substrate comprises a resin-impregnated inorganic fiber.

23. The method of manufacturing a wiring board according to claim 22, wherein the inorganic fiber comprises a glass cloth.

24. The method of manufacturing a wiring board according to claim 22, wherein the inorganic filler comprises at least one of a silica filler a glass filler.

25. The method of manufacturing a wiring board according to claim 15, further comprising:
forming a conductive pattern on the first substrate;
forming a conductive pattern on the second substrate; and
connecting the conductive pattern on the first substrate and the conductive pattern on the second substrate by the IVH.

26. The method of manufacturing a wiring board according to claim 15, further comprising:
forming a plurality of stacked vias in each of the first substrate and the second substrate;
forming a conductive layer on an inner surface of at least one of the stacked vias by plating; and
filling at least one of the stacked vias with a metal.

27. The method of manufacturing a wiring board according to claim 15, further comprising:
forming a plurality of stacked vias in each of the first substrate and the second substrate;
forming a conductive layer on an inner surface of at least one of the stacked vias by plating; and
filling at least one of the stacked vias with a resin.

28. The method of manufacturing a wiring board according to claim 15, wherein the first substrate comprises a first lower-layer insulation layer and a first upper-layer insulation layer, and the second substrate comprises a second lower-layer insulation layer and a second upper-layer insulation layer.

29. The method of manufacturing a wiring board according to claim 28, further comprising:
forming a conductive pattern on each of the first and second upper-layer insulation layers;
forming a conductive pattern on each of the first and second lower-layer insulation layers; and
connecting each conductive pattern on the first and second upper-layer insulation layers to a respective conductive pattern on the first and second lower-layer insulation layers through a plurality of stacked vias.

* * * * *